(12) United States Patent
Naven

(10) Patent No.: US 6,418,077 B1
(45) Date of Patent: Jul. 9, 2002

(54) MEMORY ACCESS METHODS AND DEVICES FOR USE WITH RANDOM ACCESS MEMORIES

(75) Inventor: Finbar Naven, Cheadle Hulme (GB)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/192,488

(22) Filed: Nov. 17, 1998

(30) Foreign Application Priority Data

Dec. 17, 1997 (GB) .............................................. 9726668

(51) Int. Cl.⁷ ................................................ G11C 8/00
(52) U.S. Cl. .................................. 365/233; 365/230.03
(58) Field of Search ........................... 365/233, 189.01, 365/230.03

(56) References Cited

U.S. PATENT DOCUMENTS

| | | | |
|---|---|---|---|
| 5,367,494 A | 11/1994 | Shebanow et al. | 365/230.03 |
| 5,420,997 A | 5/1995 | Browning et al. | 395/425 |
| 5,592,432 A * | 1/1997 | Vishlitzky et al. | 365/230.03 |
| 5,636,173 A | 6/1997 | Schaefer | 365/230.03 |
| 5,748,551 A | 5/1998 | Ryan et al. | 365/230.03 |

FOREIGN PATENT DOCUMENTS

| | | |
|---|---|---|
| EP | 0224691 | 6/1987 |
| EP | 0 737 981 | 10/1996 |
| EP | 0 747 825 | 12/1996 |
| GB | 2 248 322 | 5/1992 |
| GB | 2 271 003 | 3/1994 |
| WO | 97/39437 | 10/1997 |

OTHER PUBLICATIONS

Fujitsu Product Profile Sheet MB811171622A, Edition 1.0 Jul. 1996, "CMOS 2×512K×16 Synchronous DRAM".
Dialog Accession No. 01603522 & Microprocessor Report, v7, n7, p10(2), May 31, 1993, Case B, "AMD upgrades performance of 29200 . . . ".

* cited by examiner

Primary Examiner—David Nelms
Assistant Examiner—M. Tran
(74) Attorney, Agent, or Firm—Staas & Halsey LLP

(57) ABSTRACT

In a memory access method used with a synchronous dynamic random access memory (SDRAM) having first and second banks, each information item is allocated respective first and second storage locations in the memory. The first and second storage locations are in the first and second banks (Bank 0, Bank 1) respectively.

When, in the same time slot, it is required to write a first such information item (W) in the memory and to read a second such information item (R) from the memory, it is firstly determined which of the first and second banks currently holds the second information item (R). The first information item (W) is written in the first storage location allocated thereto if the determined bank is the second bank and is written in the second storage location allocated thereto if the determined bank is the first bank. The second information item (R) is read from the determined bank after the first information is written.

As a result, the write and read operations can be interleaved, providing increasing throughput as is desirable in, for example, pipelined memory access systems.

Other SDRAM access methods and devices for improving throughput are also disclosed, and the methods and devices are applicable more generally to other kinds of random access memory system including static RAMs and disk storage systems.

51 Claims, 22 Drawing Sheets

4 read and 4 write sequence 4 write and 4 read sequence

Optimum sequence order (bursts of 4 words) :-

Write bank 0
Read bank 1
Write bank 1
Read bank 0

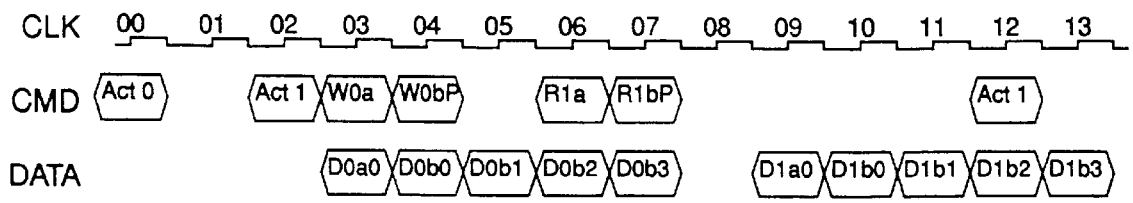
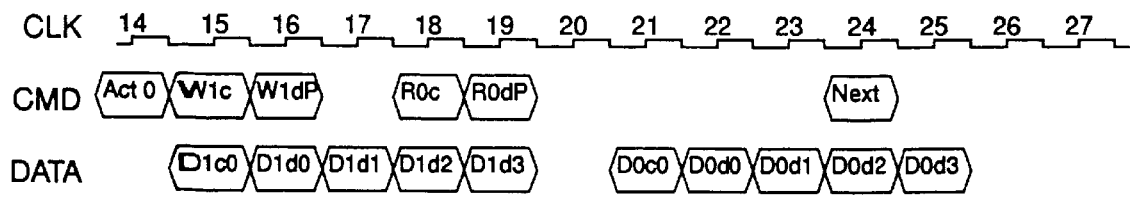
Optimum sequence order (bursts of 5 words) :- same as 4 word example
FIG. 8A
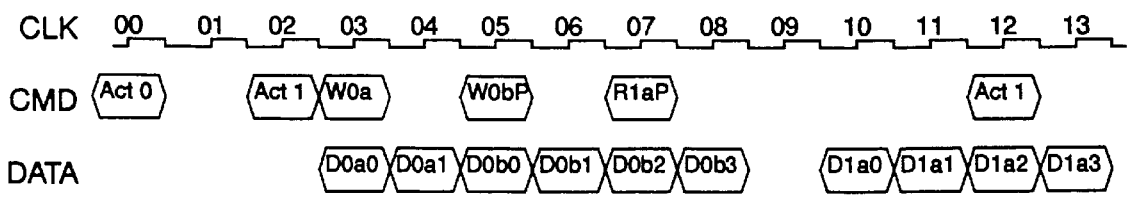
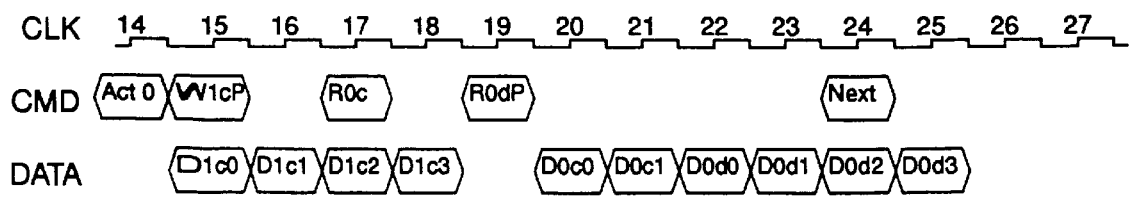
Optimum sequence order (asymmetrical bursts) :-
Write bank 0 (6 words ie the larger write burst)
Read bank 1 (4 words ie the smaller read burst)
Write bank 1 (4 words ie the smaller write burst)
Read bank 0 (6 words ie the larger read burst)
FIG. 8B Read/Read: Two groups of 4 reads to same bank (16 clocks)

Write/Write : 4 writes to each bank (15 clocks)

Read/Read : 4 reads to each bank (12 clocks)

Write/Read : 4 writes and 4 reads to different banks (11 clocks)

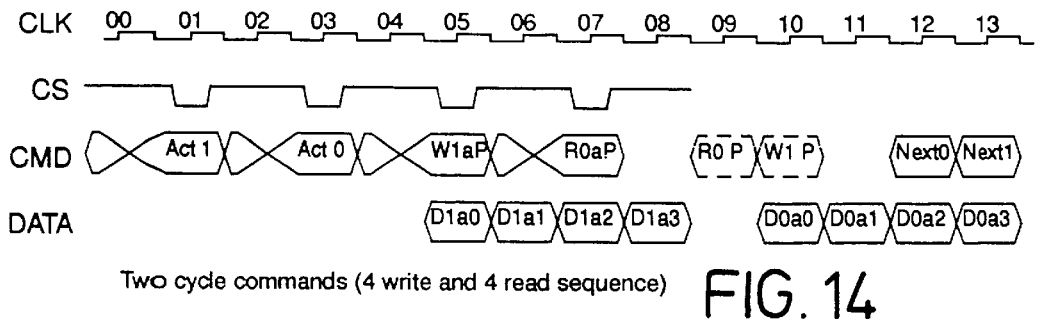
Two cycle commands (4 write and 4 read sequence) FIG. 14
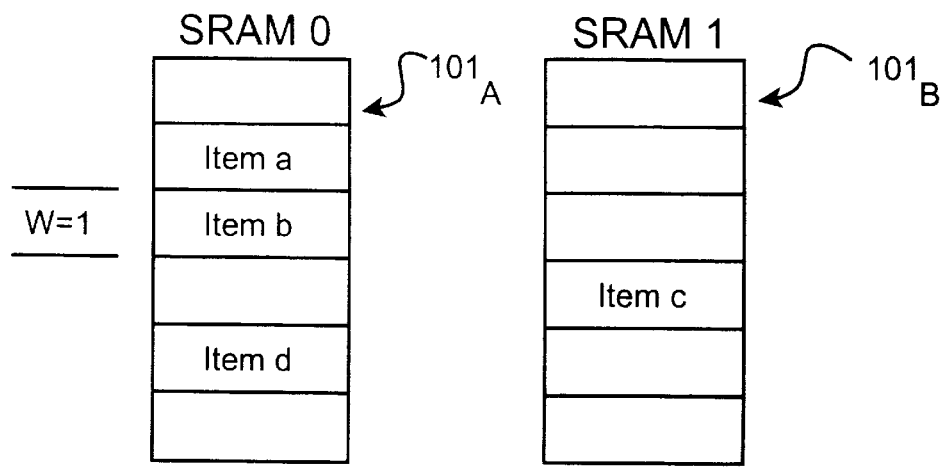
FIG. 15A
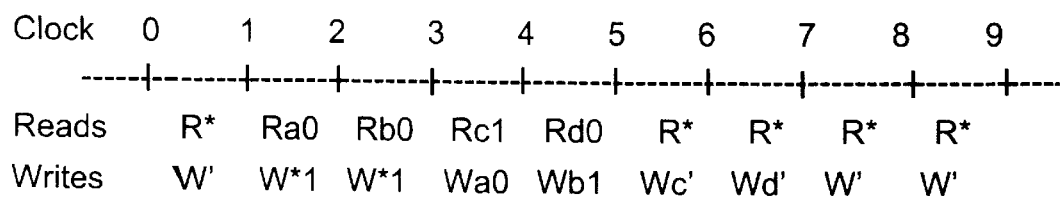
FIG. 15B

MEMORY ACCESS METHODS AND DEVICES FOR USE WITH RANDOM ACCESS MEMORIES

BACKGROUND OF THE INVENTION

1. Field of the Invention

The present invention relates to memory access methods and devices for use with random access memories and, in particular but not exclusively, with synchronous dynamic random access memories (SDRAMs).

2. Description of the Related Art

SDRAM devices are designed so as to be simpler to use than standard dynamic random access memories (DRAMs) which suffer from many control signal timing constraints. The data bandwidth of such an SDRAM device may be as much as 5 times that of a standard DRAM, making the SDRAM device ideally suited for use in, for example, laser printers, high resolution graphic adapters, accelerators, and other applications where an extremely large memory and bandwidth are required.

A typical organisation of an SDRAM device is shown in FIG. 1 of the accompanying drawings. Such a device is described, for example, in detail in "Product Profile Sheet: MB811171622A CMOS 2×512 K×16 Synchronous DRAM", Fujitsu Limited, July 1996.

At the core of the SDRAM device 1 are two banks 2 and 3, each of which is constituted by a matrix of memory cells. In each bank, the matrix is organised to provide storage for 512 K words of 16 bits (K=1024). A total of 20 address input signals are required to identify a particular word in one of the banks 2 or 3. To reduce the pin count of the device, an 11-bit row address A0 to A10 is supplied first to an address buffer/register 4 of the device, whereafter an 8-bit column address A0 to A7 is applied to the address buffer/register 4. A further address bit A11 is used as a bank select signal for selecting either the first bank 2 or the second bank 3 of the device.

The SDRAM device 1 further comprises a clock buffer 5, command decoder 6, input/output data buffer/register 7, control signal latches 8 and 9 corresponding respectively to the two banks 2 and 3, a mode register 10, and column address counters 11 and 12 corresponding respectively to the banks 2 and 3. The constitution and operation of the elements of the SDRAM device 1 shown in FIG. 1 are well-known in the art and so will not be described further herein.

There are three major differences between the SDRAM device 1 and a conventional DRAM. The first, and most important, difference is that the SDRAM operates synchronously using a clock input for synchronisation purposes, whereas the conventional DRAM is essentially an asynchronous memory device even though it makes use of timing signals RAS and CAS. In the conventional DRAM, each operation is determined by the phase differences between these two timing signals, whereas in the SDRAM device 1 of FIG. 1, each operation is determined by commands and all operations are referenced to a positive clock edge.

The SDRAM device 1 of FIG. 1 also differs from the conventional DRAM in that it is capable of operating in a burst mode which is a very high speed access mode (read or write) utilising the internal column address counters 11 and 12. Once a column address for the first access is set, the following addresses are automatically generated by one of the internal column address counters 11 or 12.

Further, the SDRAM device 1 of FIG. 1 differs from the conventional DRAM in having the mode register 10 which serves to configure the SDRAM operations and functions so as to achieve desired system conditions.

Each bank 2 or 3 in FIG. 1 contains multiple pages, for example there may be 2 K pages, each containing 256 words. To access (read or write) an item of information within a page, the bank containing the page must be in a defined state, i.e. the bank must have been precharged, and the page must have been activated. These precharge and activation operations require clock cycles. Accordingly, a precharge is best carried out when accessing of one page is finished with, so that the next page is then ready for immediate activation when required.

As mentioned above, SDRAM devices are synchronous devices, and actions are carried out on the positive clock edge. An SDRAM device can be programmed to process commands after n clock cycles (n=1, 2 or 3), and n=3 usually enables the highest throughput.

Information can be accessed in bursts, but (unfortunately for ease of use) the leading and trailing parts (protocols) of the access sequence differ between reads and writes. The burst length can be programmed, but is usually set to either 4 or 8 words, particularly when the accesses are relatively short and random. Bursts can be terminated automatically by precharge commands, or these can be issued explicitly. Automatically terminated read bursts give performance advantages, but automatically terminated write bursts do not (in this case the automatic precharge command simply eliminates the need to issue an explicit precharge command).

Bursts that are not automatically terminated by precharge can be interrupted and terminated by other bursts, but it is best to terminate reads with reads and writes with writes, and to ensure that the final burst access is of the automatically precharged type.

SDRAM devices naturally achieve high throughputs of information if the burst lengths are greater than eight words (sufficient to hide the leading and trailing read and write access protocols), and banks can be continually interleaved. However, these criteria are not easy to achieve in some of the applications in which SDRAM devices are normally considered for use. For example, in asynchronous transfer mode (ATM) communication systems, SDRAM devices are considered attractive for storing information items (e.g. transient control parameters) relating to ATM cells. If the ATM cells are to be processed at rates of 622 MHz or higher, the cell lifetimes are relatively short, for example 680 ns. The processing of cells is normally pipelined, so that, within a single ATM cell lifetime (680 ns), it may be necessary to write one or more information items and to read one or more information items. To secure the expected benefits (e.g. performance and memory depth) of SDRAM devices in such demanding situations, it is therefore desirable to provide improved methods and devices for accessing information items stored in SDRAM devices.

The same requirements can arise in random access memory systems not employing SDRAM devices. For example, so-called Rambus devices are commercially available (example devices are the NEC uPD488130L and the Toshiba TC59R0808HK) which, in common with SDRAM devices, have two (or more) banks which share a common data bus. Rambus DRAMs (or RDRAMS) are developed and marketed by Rambus Inc., a high-speed interface technology company, and can transfer data at 600 megabytes per second or more over a so-called Rambus Channel, a narrow byte-wide data bus. Rambus DRAMs can provide 8 times the bandwidth per pin of alternative high-speed DRAM components. Rambus memories are accessed using protocols that require a relatively high number of clock cycles to initiate the access (even more than SDRAM devices). In these Rambus devices, additional clock cycles also elapse before the data starts to be transferred. To try to maintain high effective throughput rates, the size of the data transfer (burst) is usually about 32 or more bytes. Furthermore, SyncLink devices (SyncLink is a consortium of DRAM manufacturers whose goal is to create an industry standard for a new DRAM architecture which allows data transfer rates of 500 Mbytes up to 3.2 Gbytes per second) are random access memory devices with a single input/output of high bandwidth which also use protocols broadly similar to Rambus protocols.

Even in the case of random access memory systems which do not employ plural-bank individual devices (such as SDRAM devices or Rambus devices) there may arise a demand to read one or more information items from the memory and to write one or more information items to the memory in the same time slot, the duration of this time slot being less than the total time required to access the items sequentially. For example, such a demand may arise in a disk storage system or in a static random access memory (SRAM) system.

SUMMARY OF THE INVENTION

According to a first aspect of the present invention there is provided a memory access method, for use with a random access memory having first and second storage portions, which method comprises: allocating each information item respective first and second storage locations in the said memory, which first and second storage locations are in the said first and second storage portions respectively; and in the same time slot, writing a first such information item in the memory and reading a second such information item from the memory by carrying out the steps of: a) determining which of the first and second storage locations allocated to the said second information item currently holds that item; b) writing the said first information item in the said first storage location allocated thereto if the determined storage location is such a second storage location and writing the first information item in the said second storage location allocated thereto if the determined storage location is such a first storage location; and c) reading the said second information item from the said determined storage location.

The random access memory may comprise just one random access memory device that has, internally, two different storage portions that are accessed externally via a common or shared data bus. For example, an SDRAM device has two (or more) different banks that are accessed externally via a common data bus. Similarly, a Rambus device or SyncLink device also has plural banks that are accessed via a common data bus. The two storage portions could even be two different data storage surfaces of a disk drive unit that are accessed, externally of the unit, via a common data bus. In these cases, the writing step (b) and reading step (c) must be carried out sequentially because the common data bus constitutes a "data bottleneck". However, because each information item is allocated two different storage locations in different respective storage portions, it is always possible to perform the write operation in a different storage portion from the read operation (bank interleaving), so that the writing step (b) can partially overlap with the reading step (c), thereby "hiding" some of the leading or trailing protocols of the two access operations. Thus, the minimum duration of the time slot can be less than the sum of the duration of an individual read operation and the duration of an individual write operation, where the read and write operations are from/to the same bank.

In one preferred embodiment the writing of the first information item is performed before the reading of the said second information item. This provides greater throughput of data when the first and second banks form part of the same synchronous dynamic random access memory device.

Alternatively, the random access memory may comprise plural individual random access memory devices such as plural semiconductor RAM devices (e.g. SDRAM devices, static RAM devices, dynamic RAM devices, Rambus devices, SyncLink devices) or any arrangement providing two randomly-accessible storage portions, e.g. two disk drive units providing respective data storage surfaces (magnetic or optical, and hard or floppy), or even two data storage surfaces within the same disk drive unit provided that the two data storage surfaces are accessible independently via different data buses. In these cases, because each information item is allocated two different storage locations in different respective storage portions (e.g. in different semiconductor RAM devices or on different data storage surfaces), it is always possible to perform the write operation on a storage portion that is not being read in the read operation. This enables the writing step (b) to be performed in parallel with the reading step (c) so that the longer of the two steps can completely overlap the shorter of the two steps. Thus, the minimum duration of the time slot is simply equal to the duration of the longer step.

In all cases, the first and second information items may be one and the same information item.

In one embodiment, each information item has a corresponding pointer indicating in which of the first and second storage locations allocated thereto the item concerned is currently held. In step (a) the determination of the storage location currently holding the said second information item is made using the pointer corresponding to that item; and the pointer corresponding to the said first information item is updated to indicate in which of the first and second storage locations allocated thereto the item concerned is written in step (b).

According to a second aspect of the present invention there is provided a memory access method, for use with a random access memory having first and second storage portions that are accessed via a common data bus, which method comprises: allocating each information item a first storage location for storing a first part of the item and a second storage location for storing a second part of the item, the first and second storage locations being in the said first and second storage portions respectively; in the same time slot, writing a first such information item in the memory and reading a second such information item from the memory by carrying out in a predetermined sequence the steps of a) writing the said first part of the said first information item in the said first storage location allocated to that item; b) writing the said second part of the said first information item in the said second storage location allocated to that item; c) reading the said first part of the said second information item from the said first storage location allocated to that item; and d) reading the said second part of the said second information item from the said second storage location allocated to that item.

The first and second storage portions may be provided respectively by two different banks of the same synchronous dynamic random access memory device or of the same Rambus or SyncLink device. Alternatively, the first and second storage portions may be provided by two different data storage surfaces of the same disk drive unit.

This access method splits an individual information item across two different storage portions, which can then always be accessed as an interleaved pair while utilising all of the memory for storage. As bursts approach eight or more words in length in an SDRAM, it becomes easier to hide bank swapping overheads. This method has a slightly-reduced throughput, as compared to the basic dual-bank access method embodying the aforesaid first aspect of the present invention, but has the advantage of providing 100% memory utilisation.

To enhance throughput the said predetermined sequence in which the said steps (a) to (d) are performed preferably includes at least one pair (more preferably still, two pairs) of successive steps in which the first step of the pair is a write to one of the two storage portions (banks) and the second step of the pair is a read of the other of the two storage portions (banks). For example, in one preferred embodiment the said sequence is step (a) followed by step (d) followed by step (b) followed by step (c).

The first and second information items may be one and the same information item.

The said first and second parts of each information item may be of the same length, or alternatively the length of the said first part of each information item may be different from the length of the said second part of each information item. In the latter case it is preferable, from the point of view of throughput, that the last step of the sequence in which the said steps (a) to (d) are performed is the step of reading the longer of the two parts of the said second information item.

It is also useful, when the lengths of the first and second parts of each information item are different, to make the length of the shorter of the two parts of each said information item less than or equal to the number of words that can be accessed in a single burst. Because the shorter part can be accessed in a single burst, the overall number of commands and addresses required to complete steps (a) to (d) is reduced. In this way, design complexity can be reduced or additional sequence flexibility is facilitated.

The storage location allocated for storing the shorter of the two parts of each information item may be longer than that shorter part, so that spare words in that storage location can be used for storing information other than the information-item part to which that storage location is allocated. Preferably, the number of spare words is equal to the number of words that can be accessed in a single burst. This makes access to the spare words efficient.

According to a third aspect of the present invention there is provided a memory access method, for use with a random access memory having respective first and second storage portions that are accessed via a first common data bus and also having respective third and fourth banks that are accessed via a second common data bus, which method comprises: allocating each information item respective first, second, third and fourth storage locations in the first, second, third and fourth storage portions respectively; and in the same time slot, writing first and second such information items in the memory and reading third and fourth such information items from the memory by carrying out the steps of: a) determining which of the storage locations allocated to the third information item currently holds that item and determining which of the storage locations allocated to the fourth information item currently holds that item, and identifying the storage portion(s) in which the two determined storage locations are included; b) writing the first and second information items to respective storage locations in two different storage portions other than the identified storage portion(s); and c) reading the said third and fourth information items from their respective determined storage locations.

By allocating each information item four different storage locations in different respective storage portions, the two write operations can always be performed on storage portions that are not being read. Usually (i.e. except when the third and fourth information items are held in the same storage portion) it is possible, for each pair of storage portions that share a common data bus for access, to perform a read from one storage portion of the pair and a write to the other storage portion of the pair, the read and the write being capable of partially overlapping because they are from/to different storage portions of the same access pair. Thus, the minimum duration of the time slot can be less than the sum of the respective durations of non-interleaved read and write operations. Also, even when the third and fourth information items are held in the same storage portion, the two writes are both carried out in the two different storage portions of a single access pair, making it possible to benefit from write interleaving.

The said first and second storage portions may be provided respectively by two different banks of a first synchronous dynamic random access memory device, and the said third and fourth storage portions may be provided respectively by two different banks of a second synchronous dynamic random access memory device. In this case, when it is identified in step (a) that the determined storage locations for the third and fourth information items are included in different respective banks and that one of those banks forms part of the first synchronous dynamic random access memory device whilst the other of those banks forms part of the said second synchronous dynamic random access memory device, in each such device the writing of step (b), to the bank other than the identified bank of the device concerned, is performed before the reading of step (c) from that identified bank. This has the effect of increasing throughput.

Alternatively, the first and second storage portions may be provided by two different banks of a first Rambus or SyncLink device and the third and fourth storage portions may be provided by two different banks of a second Rambus or SyncLink device. As a further possibility, the first and second storage portions may be provided by two different data storage surfaces of a first disk drive unit and the third and fourth storage portions may be provided by two different data storage surfaces of a second disk drive unit.

One of the items being read may be the same as one of the items being written, or both items being read may be the same as the items being written.

In one preferred embodiment, each said information item has a corresponding pointer indicating in which of the said first, second, third and fourth storage locations allocated thereto the item concerned is currently held. In step (a), for each of the third and fourth information items, the determination of the storage location currently holding the item concerned is made using the pointer corresponding to that item. Furthermore, for each of the first and second information items, the pointer corresponding to the item concerned is updated to indicate in which of the first, second, third and fourth storage locations allocated thereto the item concerned is written in step (b).

According to a fourth aspect of the present invention there is provided a a memory access method, for use with a dynamic random access memory having respective first and second storage portions that are accessed via a first common data bus and also having third and fourth storage portions that are accessed via a second common data bus, which method comprises: allocating each information item respective first and second pairs of storage locations, each pair being made up of a first storage location for storing a first part of the item concerned and a second storage location for storing a second part of the item concerned, the said first and second storage locations of the first storage-location pair being in the first and second storage portions respectively and the said first and second storage locations of the second storage-location pair being in the third and fourth storage portions respectively; and in the same time slot, writing first and second such information items in the memory and reading third and fourth such information items from the memory by carrying out the steps of: a) determining, for each of the third and fourth information items, which of the first and second pairs of storage locations allocated to the item currently holds the item; b) writing the first and second parts of the first information item in the first and second storage locations respectively of the storage-location pair other than the determined storage-location pair for the third information item; c) writing the first and second parts of the second information item in the first and second storage locations respectively of the storage-location pair other than the determined storage-location pair for the fourth information item; d) reading the first and second parts of the third information item from the first and second storage locations respectively of the determined storage-location pair for that item; and e) reading the first and second parts of the fourth information item from the first and second storage location respectively of the determined storage-location pair for that item.

This access method is effectively a combination of the access methods embodying the first and second aspects of the present invention, i.e. a combination of the dual banks and split banks access methods. As compared to the access method embodying the third aspect of the invention, which only has 25% memory utilisation, the access method embodying the fourth aspect of the invention achieves 50% memory utilisation, although at the expense of slightly reduced throughput.

One of the items being read may be the same as one of the items being written, or both items being read may be the same as the items being written.

The said first and second banks may both form part of a first synchronous dynamic random access memory device, and the said third and fourth banks may both form part of a second synchronous dynamic random access memory device. In this case, when it is determined that the third and fourth information items are currently held in different respective storage-location pairs (i.e. in different respective devices), it follows that in each of the said first and second devices one of the said writing steps (b) and (c) and one of the said reading steps (d) and (e) are to be carried out. To increase throughput it is preferable in this case that the writing step and reading step in each device are carried out in the following sequence: writing the first part of the information item to be written in the said writing step; reading the said second part of the information item to be read in the said reading step; writing the second part of the information item to be written in the said writing step; and reading the first part of the information item to be read in the said reading step.

Similarly, when it is determined that the third and fourth information items are both currently held in the same storage-location pair (i.e. in the same device), it follows that the two reading steps (d) and (e) are both to be carried out in the same one of the two devices. Again, to increase throughput, the two banks of that device are preferably read alternately in the course of carrying out the reading steps (d) and (e). Similarly, the two writing steps (b) and (c) are both to be carried out in the other of the two devices. To increase throughput, the two banks of that device are preferably written alternately in the course of carrying out the writing steps (b) and (c).

Alternatively, the first and second storage portions may be provided by two different banks of a first Rambus or SyncLink device and the third and fourth storage portions may be provided by two different banks of a second Rambus or SyncLink device. As a further possibility, the first and second storage portions may be provided by two different data storage surfaces of a first disk drive unit and the third and fourth storage portions may be provided by two different data storage surfaces of a second disk drive unit.

In one preferred embodiment, each information item has a corresponding pointer indicating in which of the first and second storage-location pairs allocated thereto the item concerned is currently held. In step (a), for each of the third and fourth information items, the determination of the storage-location pair currently holding the item concerned is made using the pointer corresponding to that item. Also, for each of the said first and second information items, the pointer corresponding to the item concerned is updated to indicate in which of the first and second storage-location pairs allocated thereto the item concerned is written in step (b) or (c).

According to a fifth aspect of the present invention there is provided memory access circuitry, for use with a random access memory having first and second storage portions, which circuitry comprises: allocation means for allocating each information item respective first and second storage locations in the said memory, which first and second storage locations are in the said first and second storage portions respectively; determining means, operable when in the same time slot a first such information item is to be written in the memory and a second such information item is to be read from the memory, to determine which of the first and second storage locations allocated to the said second information item currently holds that item; writing means for writing the said first information item in the said first storage location allocated thereto if the storage location determined by the determining means is such a second storage location and for writing the first information item in the said second storage location allocated thereto if the storage location determined by the determining means is such a first storage location; and reading means for reading the said second information item from the said determined storage location.

According to a sixth aspect of the present invention there is provided memory access circuitry, for use with a random access memory having first and second storage portions that are accessed via a common data bus, which circuitry comprises: allocation means for allocating each information item a first storage location for storing a first part of the item and a second storage location for storing a second part of the item, the first and second storage locations being in the said first and second storage portions respectively; first writing means for writing the said first part of the said first information item in the said first storage location allocated to that item; second writing means for writing the said second part of the said first information item in the said second storage location allocated to that item; first reading means for reading the said first part of the said second information item from the said first storage location allocated to that item; second reading means for reading the said second part of the said second information item from the said second storage location allocated to that item; and access control means operable, when in the same time slot a first such information item is to be written in the memory and a second such information item is to be read from the memory, to activate each of the said first and second writing means and each of the said first and second reading means once in a predetermined sequence.

According to a seventh aspect of the present invention there is provided memory access circuitry, for use with a random access memory having respective first and second storage portions that are accessed via a first common data bus and also having respective third and fourth storage portions that are accessed via a second common data bus, which circuitry comprises: allocation means for allocating each information item respective first, second, third and fourth storage locations in the first, second, third and fourth storage portions respectively; and determining means, operable when in the same time slot first and second such information items are to be written in the memory and third and fourth such information items are to be read from the memory, to determine which of the storage locations allocated to the third information item currently holds that item and to determine which of the storage locations allocated to the fourth information item currently holds that item, and to identify the storage portion in which the two determined storage locations are included; writing means for writing the first and second information items to respective storage locations in two different storage portions other than the storage portion(s) identified by the determining means; and reading means for reading the said third and fourth information items from their respective storage locations determined by the determining means.

According to an eighth aspect of the present invention there is provided memory access circuitry, for use with a random access memory having respective first and second storage portions that are accessed via a first common data bus and also having respective third and fourth storage portions that are accessed via a second common data bus, which circuitry comprises: allocation means for allocating each information item respective first and second pairs of storage locations, each pair being made up of a first storage location for storing a first part of the item concerned and a second storage location for storing a second part of the item concerned, the said first and second storage locations of the first storage-location pair being in the first and second storage portions respectively and the said first and second storage locations of the second storage-location pair being in the third and storage portions respectively; determining means operable, when in the same time slot first and second such information items are to be written in the memory and third and fourth such information items are to be read from the memory, to determine, for each of the third and fourth information items, which of the first and second pairs of storage locations allocated to the item currently holds the item; first writing means for writing the first and second parts of the first information items in the first and second storage locations respectively of the storage-location pair other than the storage location pair determined for the third information item by the determining means; second writing means for writing the first and second parts of the second information item in the first and second storage locations respectively of the storage-location pair other than the storage-location pair determined for the fourth information item by the determining means; first reading means for reading the first and second parts of the third information item from the first and second storage locations respectively of the determined storage-location pair for that item; and second reading means for reading the first and second parts of the fourth information item from the first and second storage location respectively of the determined storage-location pair for that item.

According to a ninth aspect of the present invention there is provided synchronous dynamic random access memory apparatus including: respective first, second and third synchronous dynamic random access memory devices, each device having two banks; and access control means connected to the said first, second and third devices and operable to cause mutually-corresponding banks of the first and second devices to be accessed in parallel with one another, whilst permitting the banks of the said third device to be accessed individually.

Such apparatus can enable information items of different lengths to be accessed conveniently and at high speed.

To enhance the flexibility of the apparatus, a burst length of the said first and second devices may be different from a burst length of the said third device. Alternatively, or in addition, the banks of one (or each) of the devices may be of a different width from those of another (or each other) of the devices.

According to a tenth aspect of the present invention there is provided synchronous dynamic random access memory apparatus including respective first and second synchronous dynamic random access memory devices, each device having two banks, and the banks of the first device being of a different width from the banks of the second device.

Such apparatus can also enable information items of different lengths to be accessed conveniently and at high speed.

According to an eleventh aspect of the present invention there is provided synchronous dynamic random access memory apparatus including: a plurality of (e.g. more than 3 or more than 4) synchronous dynamic random access memory devices operable synchronously in accordance with clock cycles; and memory access means connected to each said device of the said plurality by way of a common control bus through which the memory access means supply commands and addresses to the devices in parallel so as to cause the devices to perform predetermined access operations in parallel, the said commands and addresses each occupying a period of more than one said clock cycle.

In such apparatus, although the lines of the common control bus are heavily loaded, by allowing each command and address to be supplied over more than one clock cycle (e.g. 2 clock cycles) the devices can still operate correctly. By using longer bursts it is possible to avoid command clashes. The control pin count is reduced.

Preferably, the devices are deactivated using their respective chip select signals (which signals can be changed at the clock-cycle repetition rate) when, during the command-supply period, the lines of the common control bus used to supply commands and addresses to the devices are not yet settled.

BRIEF DESCRIPTION OF THE DRAWINGS

FIGS. 8A and 8B are timing diagrams relating to respective further memory access methods embodying the second aspect of the invention;

FIG. 14 shows a timing diagram corresponding to FIG. 3B but relating to operations in a modified form of the FIG. 13 memory system;

FIGS. 15A and 15B show respective diagrams for use in explaining application of a memory access method embodying the aforesaid first aspect of the present invention to a random access memory system including static RAM devices.

DETAILED DESCRIPTION OF THE PREFERRED EMBODIMENTS

Figure 1:
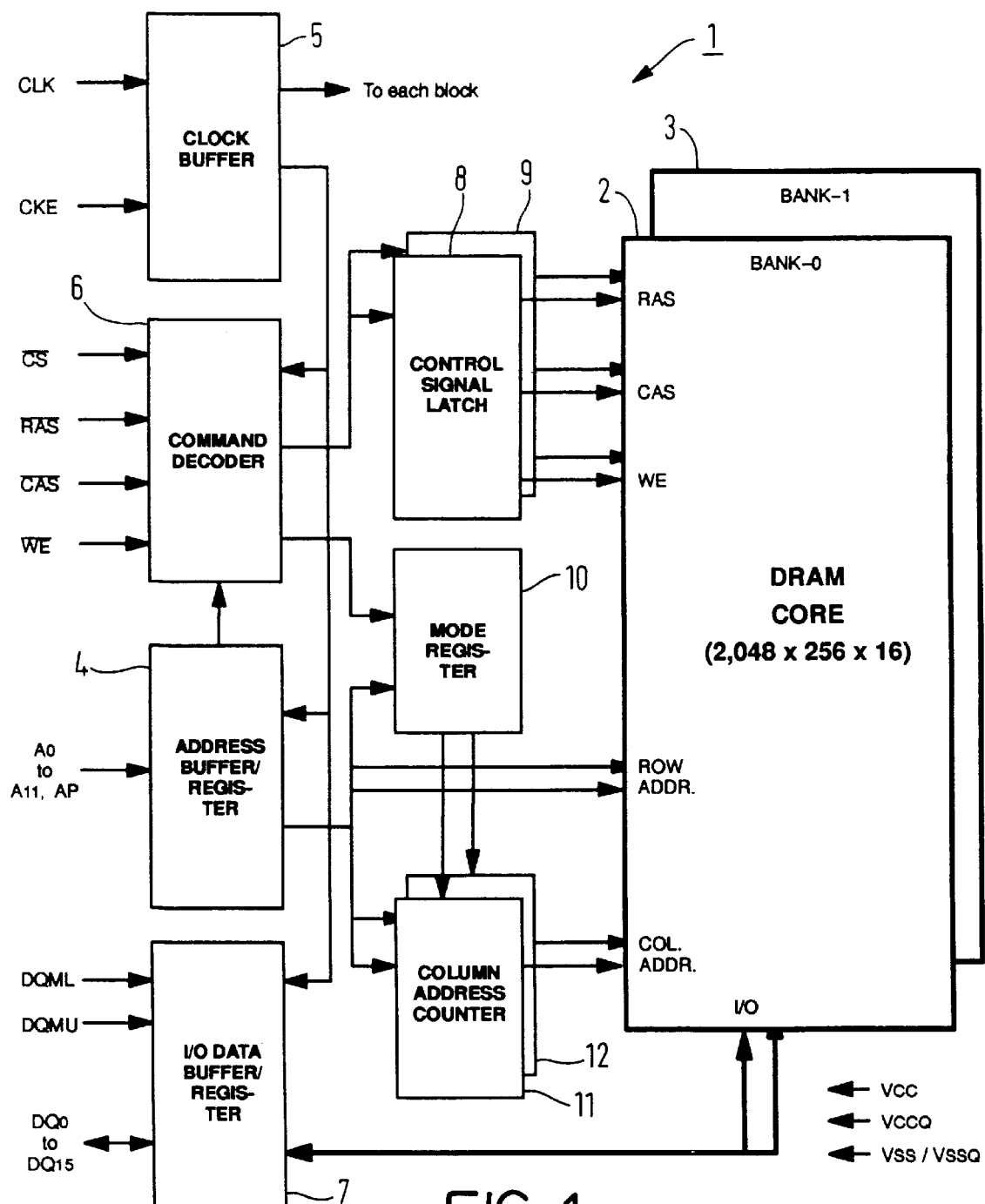
FIG. 1, discussed hereinbefore, shows an example configuration of a SDRAM device suitable for use in embodiments of the present invention.

Before describing preferred embodiments of the present invention, basic burst-mode read and write operations in a SDRAM device such as the device of FIG. 1 will be explained with reference to FIGS. 2A to 2C.

Figure 2A:
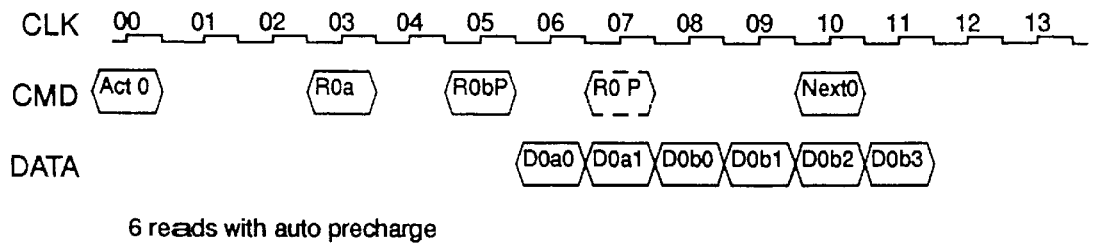
FIGS. 2A to 2C show respective timing diagrams representing respectively different types of burst access operations in a SDRAM device.
Figure 2B:
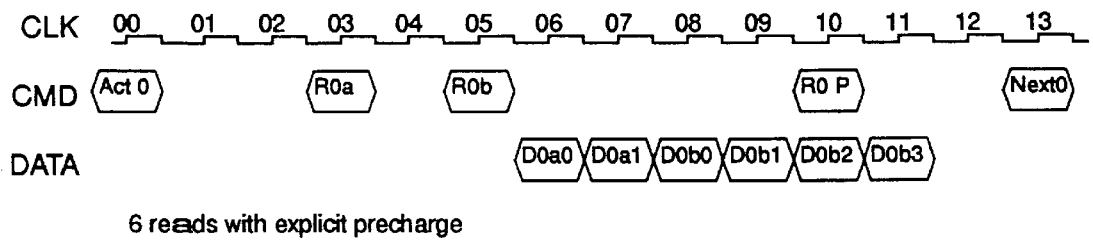
Figure 2C:
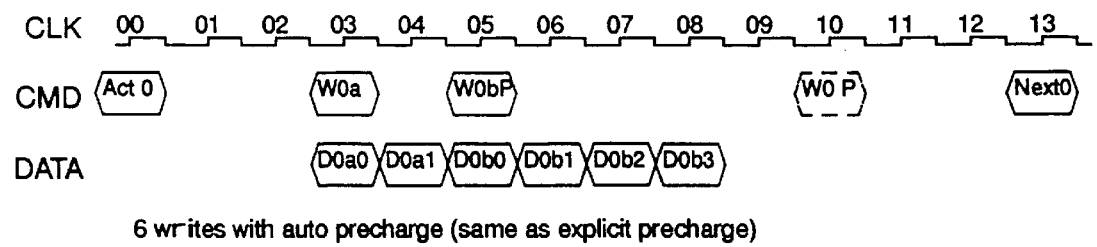

In each case shown in FIGS. 2A to 2C, the information items being accessed are of length six words, and the burst length parameter (BL) of the SDRAM device is set to four. Thus, two words of each information item are accessed in a first burst, followed by the remaining four words in a second burst which terminates the first burst.

In FIGS. 2A to 2C, and in all of the remaining timing diagrams in the accompanying set of drawings, the nomenclature used has the following meanings:

Act i: activate bank i (i=0 or 1)

Ria: read bank i in a burst starting from address a

Wia: write bank i in a burst starting from address a

RibP: read bank i in a burst starting from address b with auto precharge

Dibj: word j (j=0 to 3 when the burst length parameter BL=4) of a burst having a start address b in bank i Next i: in this cycle the next "activate" command (Act i) can be issued to the bank or device.

Each clock cycle commences at a rising edge of the clock signal CLK applied to the SDRAM device, and continues to the start of the next rising edge. For example, clock cycle 0 commences at the rising edge labelled "00" in the Figures and continues up to the next rising edge labelled "01".

FIG. 2A shows the timing sequence in an operation of reading an information item from bank 0. At clock edge 00, bank 0 is activated (Act 0) and the device becomes ready to process a read command R0a, specifying a burst-type read of bank 0 starting from address a, at clock edge 03. The first word D0a0 of the resulting read data is available at clock edge 06. Before this, at clock edge 05, a second read command R0bP, specifying a burst-type read of bank 0 starting from address b, is processed by the device. The second read command R0bP has the effect of terminating the execution of the first read command R0a in clock cycle 7, but before this, at clock edge 07 itself, the second word D0a1 of the first read burst is output from the device. Then at clock edges 08 to 11 the four words D0b0, D0b1, D0b2 and D0b3 of the second read burst are output respectively from the device. The second read command R0bP includes an auto precharge command which takes effect at clock edge 07 as shown by the command R0P having the dotted outline in FIG. 2A. The next activate command for the same bank (i.e. bank 0 in this example) can be issued at clock edge 10, three cycles after the automatic precharge command takes effect.

FIG. 2B shows another read operation of an information item. This differs from the read operation shown in FIG. 2A in that the second read command, issued at clock edge 05, does not have an auto precharge command. Accordingly, an explicit precharge command must be issued before the next activate command for the same bank can be applied. This explicit precharge command R0 P cannot be issued until clock edge 10, assuming that the final word D0b3 of the second burst is required, so that in the FIG. 2B read example the next activate command cannot be issued until clock edge 13, three cycles after the explicit precharge command. This shows that the non-auto precharged example of FIG. 2B is less efficient than the auto-precharged example of FIG. 2A.

FIG. 2C shows an operation of writing an information item. Bank 0 is activated (Act 0) at clock edge 0 and, three cycles later, the device is ready to process a first write command W0a, specifying a burst-type write to bank 0 starting at address a. The first word D0a0 of the write data must be supplied in the same clock cycle as the write command itself. At clock edge 04 the second word D0a1 of the first write burst is applied to the device. Then, at clock edge 05 a second write command W0bP, specifying a burst-type write operation to bank 0 starting at address b and having an auto precharge command, is applied to the device, the first word D0b0 of the data to be written in the second burst also being applied to the device at clock edge 05. This second write command has the effect of terminating the first write burst. The precharge command takes effect at clock edge 10, two clock cycles after the final word D0b3 of the second burst is written. Thus, the next activate command for the same bank cannot be issued until clock edge 13, three cycles after the precharge command takes effect.

In the write operation shown in FIG. 2C, the second write command W0bP issued at clock edge 05 could be of the non-precharged type, in which case an explicit precharge command would need to be supplied at clock edge 10. In this case, since the auto precharge command does not take effect until clock edge 10 in FIG. 2C there is no advantage (in time terms at least) in making the second write command W0bP of the auto-precharged variety.

Figure 3A:
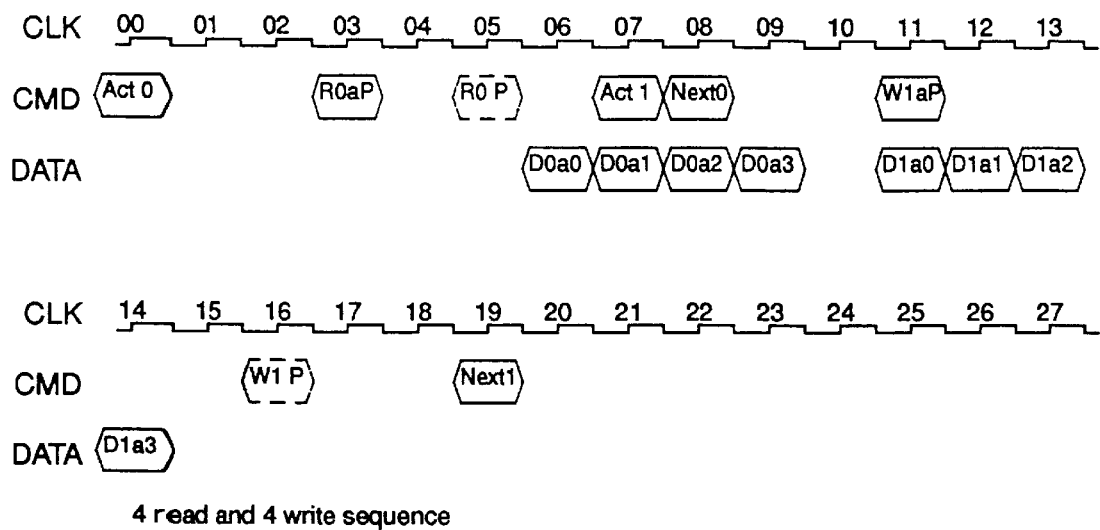
FIGS. 3A and 3B show respective timing diagrams for use in explaining bank-interleaved burst access operations in a SDRAM device.
Figure 3B:
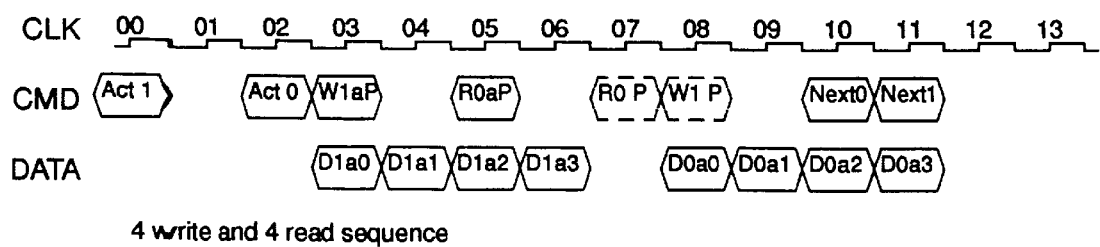

FIGS. 3A and 3B show respective timing diagrams for use in explaining bank-interleaved reads and writes, i.e. a sequence in which a read operation from one bank of a SDRAM device is performed before or after a write operation to the other bank of the device. In this case, the order in which the read and write accesses are performed can affect performance.

In FIGS. 3A and 3B, each individual access operation (i.e. a write operation or a read operation) involves an information item of length four words. It is assumed that the burst length parameter BL of the SDRAM device is set equal to four, so that an entire information item can be read or written in a single burst. It is also assumed that the information item W to be written is to be written to bank 1 and that the information item R to be read is in bank 0. Each bank must follow the basic read or write protocols already explained, with some additional rules to cope with bank activation and data bus bi-directionality requirements.

If the read (of bank 0) is performed before the write (to bank 1), as shown in FIG. 3A, the entire sequence is not completed until clock cycle 19, when the SDRAM device can accept another random access to any bank (even though bank 0 is available from clock cycle 8).

When, on the other hand, the write is performed before the read, as shown in FIG. 3B, the entire sequence is completed by clock cycle 11, allowing a much greater potential throughput to be achieved.

Consecutive pairs of bank interleaved reads, or consecutive pairs of bank interleaved writes, can usually be performed in any order, without affecting throughput. Similarly, a read and a write to the same bank can be done in any order as the total number of clock cycles is the same in each case.

Figure 4:
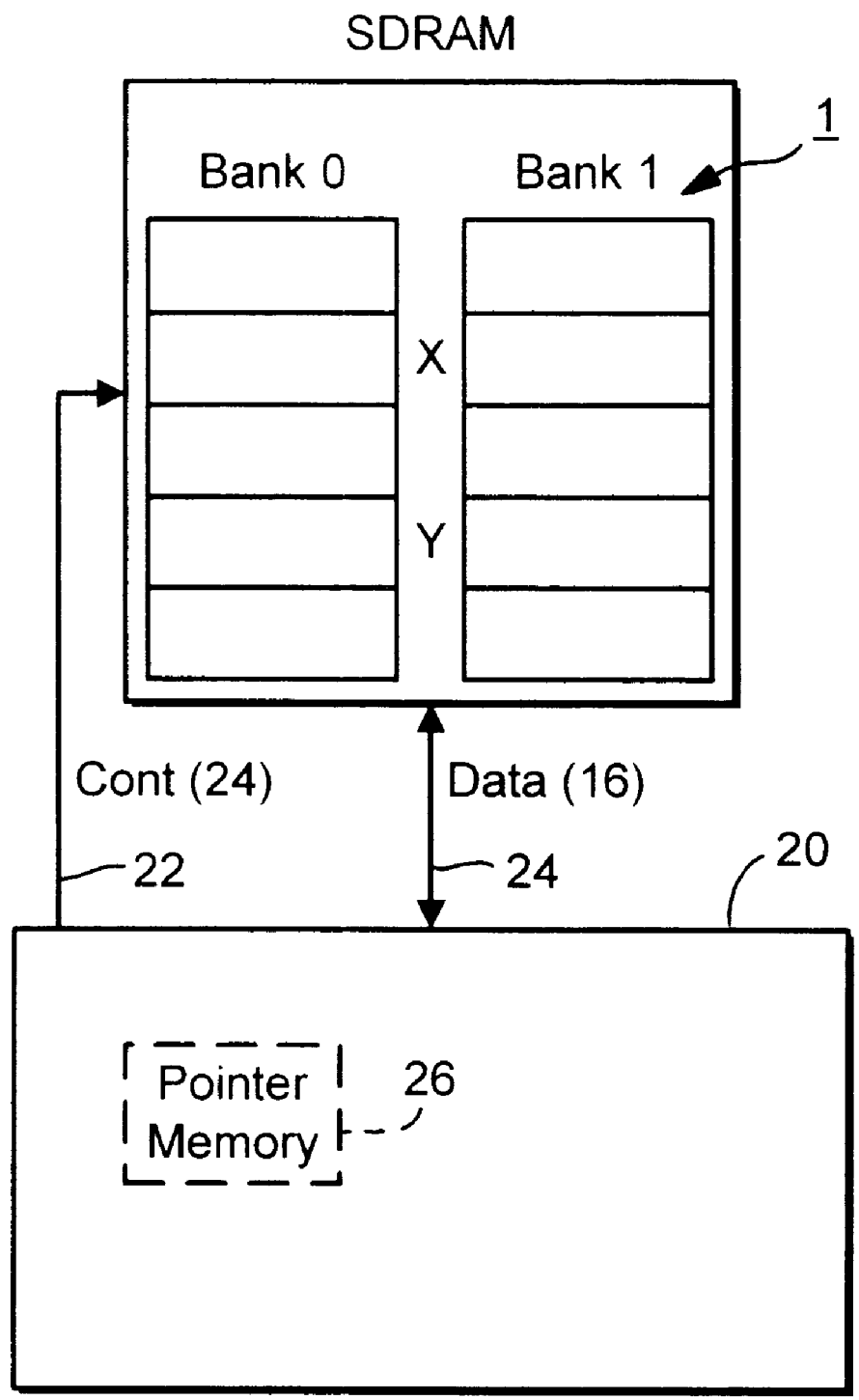
FIG. 4 shows parts of an SDRAM memory system according to a first embodiment of the present invention.

FIG. 4 shows a first embodiment of the present invention in which an SDRAM device 1 (which could have the configuration described previously with reference to FIG. 1) is connected to a memory access device 20 by a control bus 22 and a data bus 24.

The memory access device 20 is any device which requires access to the SDRAM device 1 to carry out its normal functions. For example, in an ATM network, the memory access device 20 may be a traffic management device used for transmitting and/or receiving ATM cells on one or more virtual channels. In this case, the information items stored by the memory access device 20 in the SDRAM device 1 may be, for example, so-called channel "descriptors" corresponding to individual virtual channels and specifying one or more traffic control parameters relating to the channel concerned. The channel descriptors require frequent access during normal operation of the traffic management device, for example it may be necessary to be able to read and write respective descriptors within a single ATM cell lifetime (680 ns), or even to read two descriptors and write two descriptors in such a lifetime.

When, in the same timeslot (e.g. an ATM cell lifetime), an information item (descriptor) W is to be written in the SDRAM device 1 and an information item R (which can be the same information item as the information item W, or a different information item) is read from the SDRAM device 1, a memory access method embodying the first aspect of the present invention may be employed, as will now be described with reference to FIGS. 5A and 5B. In this access method, each information item is allocated two storage locations, the first storage location being in bank 0 and the second storage location being in bank 1. In this example, the information item R is allocated storage location X in bank 0 and storage location X in bank 1, and the information item W is allocated storage location Y in bank 0 and storage location Y in bank 1. The two storage locations allocated to each item preferably have the same address (apart from the bank select bit) to simplify the access addressing, but this is not essential. Each storage location is 4 words deep. The storage locations X and Y of each bank can be in the same page or in two different pages.

A pointer memory 26 included in the memory access device 20 has an entry corresponding to each information item, which entry indicates in which of the two storage locations allocated to it the information item concerned is currently held. This pointer memory comprises a single bit per information item, which bit is set to 0 to indicate that the item is currently held in bank 0 and is set to 1 to indicate that the item is currently held in bank 1.

The method is carried out as follows. At the start of the timeslot, it is determined using the pointer memory 26 that the information item R to be read is currently held in bank 0 (FIG. 5A).

Figure 5A:
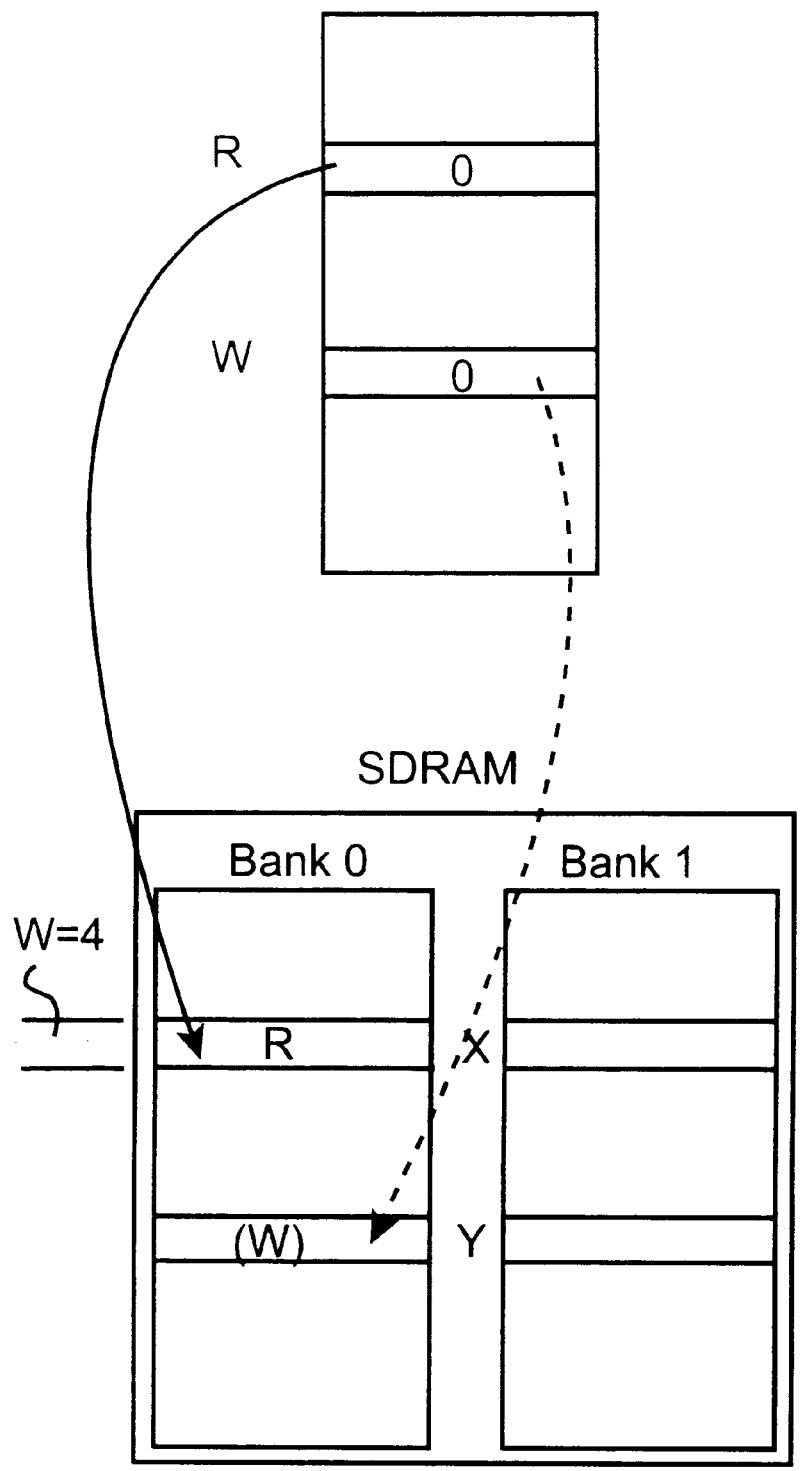
FIGS. 5A and 5B show respective diagrams for use in explaining a memory access method embodying the aforesaid first aspect of the present invention.

Incidentally, if the information item W already exists in the SDRAM device 1, then the pointer memory 26 will show in which bank it is currently held, for example in FIG. 5A the information item W is shown already existing in bank 0. It is not necessary that the information item W already exist in the SDRAM device 1 for the present memory access method to operate.

Having determined that the information item R to be read is currently held in bank 0, the memory access device 20 selects the second storage location (i.e. the storage location in bank 1) allocated to the information item W for the writing (or, as the case may be, the updating) of that information item W. Preferably, to achieve the optimum throughput, the writing of the information item W is performed before the reading of the information item R, using the sequence of commands shown in FIG. 3B. In this way, the SDRAM device can complete the write operation and the read operation in 11 clock cycles. By comparison, performing the read operation before the write operation would take 19 clock cycles, as explained previously with reference to FIG. 3A.

Figure 5B:
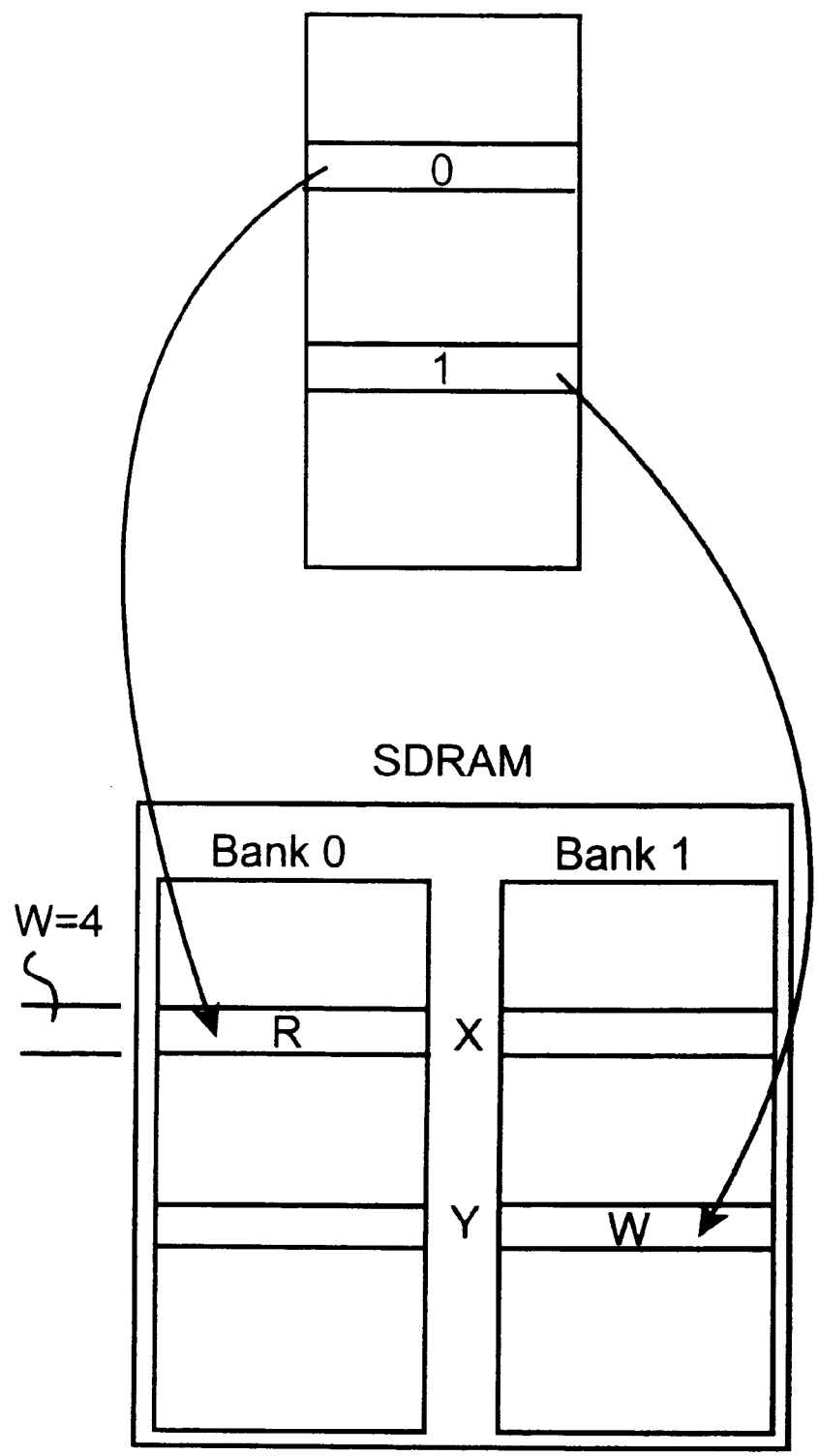

After the writing of the information item W in its allocated storage location in bank 1 the pointer memory is updated to indicate that the item W is currently held in bank 1, as shown in FIG. 5B. The pointer memory entry corresponding to the information item R is left unchanged.

It will be appreciated that the memory access method described with reference to FIGS. 5A and 5B can ensure that the write operation can always take place to the bank which is not being read in that timeslot. The disadvantage is that memory utilisation is only 50% of storage capacity.

The memory access method described above is applicable much more widely than just to SDRAM devices, and FIGS. 15A and 15B and FIGS. 16A to 16C, described later in the present specification, provide examples of the way in which the memory access method described above can be applied to random access memory systems using devices other than an SDRAM device.

The memory access method described above, employing dual banks, is reasonable for small-sized information items (four words or even eight words in length), but may become limited by the total number of items which can be stored in the "depth" of the memory. For example, a 16 Mbit DRAM (having 16 bit words) contains 512 K words per bank, which allows 64 K eight word information items to be stored. This number of information items may be too small in certain applications.

Figure 6A:
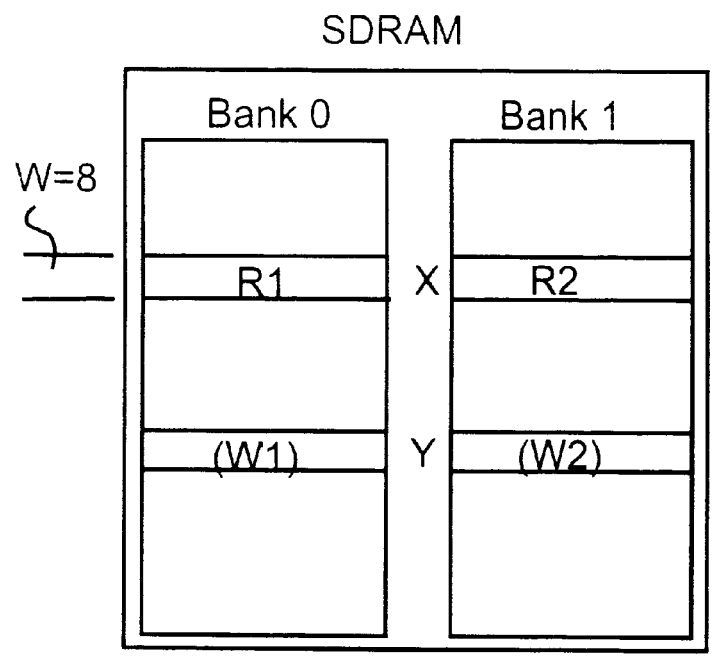
FIGS. 6A and 6B show respective diagrams for use in explaining a memory access method embodying the aforesaid second aspect of the present invention.

For data items of greater length, a memory access method embodying the second aspect of the invention may be more suitable. Again the object of the method is to read an information item R and write an information item W in the same timeslot. In this method, as shown in FIG. 6A, each individual information item is allocated two storage locations, the first storage location being in bank 0 and the second storage location being in bank 1. Unlike the memory access method described with reference to FIGS. 5A and 5B, however, the first storage location allocated to an information item is used to store a first part of the item (for example the first four words of an eight-word item) and the second storage location allocated to the item is used to store the remaining words of the item. For example, as shown in FIG. 6A, the first part R1 of a stored information item R is stored in storage location X of bank 0 and the second part R2 of that item is stored in storage location X of bank 1.

Figure 6B:
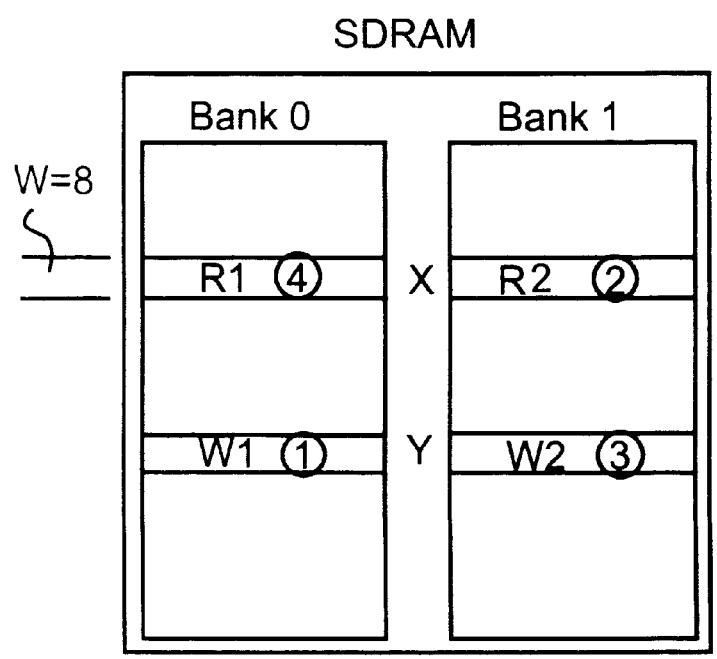

The pointer memory 26 used in the FIGS. 5A and 5B access method is not required in the access method of FIGS. 6A and 6B.

Figure 7:
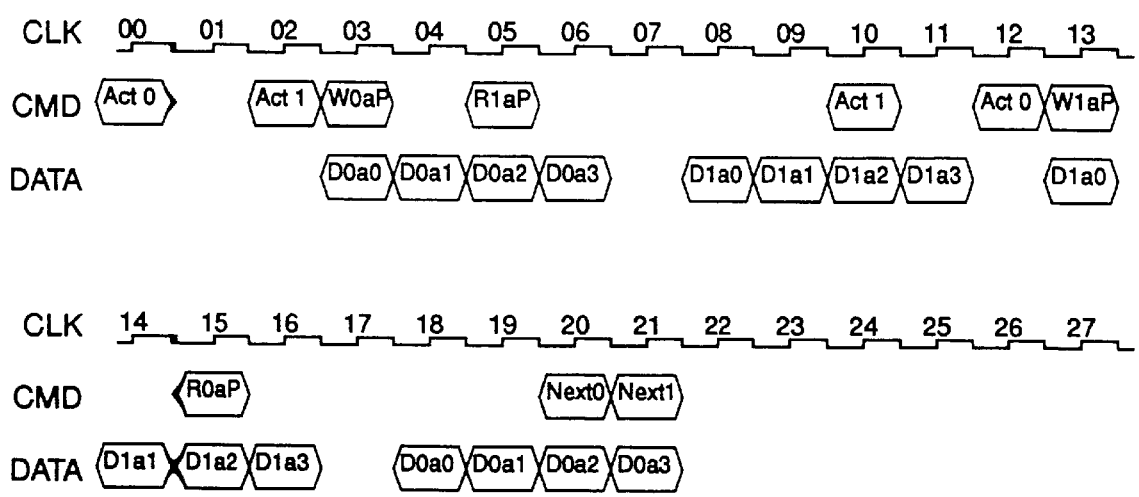
FIG. 7 shows a timing diagram relating to the method of FIGS. 6A and 6B.

The memory access method is carried out as shown in FIG. 6B. Firstly ①, the first part W1 of an information item W to be written in the SDRAM device 1 is stored by the memory access device 20 in the first storage location allocated to the item W (bank 0, storage location Y). Secondly ②, the second part R2 of the information item R to be read from the SDRAM memory in the same timeslot as the information item W is written is read from the second storage location allocated to the item R (in storage location X of bank 1). Thirdly ③, the second part W2 of the information item W is written in the second storage location allocated to the item W (in bank 1, storage location Y). Fourthly ④, the first part R1 of the information item R is read from the first storage location allocated to the item R (bank 0, storage location X). A timing diagram corresponding to the above steps is shown in FIG. 7. As can be seen from FIG. 7, assuming each information item to comprise eight words in total, with the first and second parts of the item being of equal length (four words each), the complete write and read sequence shown in FIG. 6B takes 21 clock cycles in total (the next activate command for either bank can be issued at clock edge 21).

It is not essential to perform the four steps described with reference to FIG. 6B in the order described, although this is the optimum order when the burst length parameter BL is set to four and the two parts of each item are of four words each. For example, it would be possible to carry out the steps in the following order: write bank 0; read bank 1; read bank 0; write bank 1. Alternatively, the order could be: write bank 0; write bank 1; read bank 0; read bank 1.

The split-bank access method of FIG. 6B has a slightly reduced throughput as compared to the dual-bank method described with reference to FIGS. 5A and 5B, particularly for short bursts of only four words, but does provide better (100%) storage efficiency. As bursts approach eight or more words in length, the throughput disadvantage of the FIG. 6B method becomes less and less significant, because it becomes easier to hide bank-swapping overheads.

If an information item is split into first and second parts which are stored respectively in the two banks of a SDRAM device, the two parts do not have to be of equal length. For example, a ten-word item could be split as 5+5 words, 4+6 words or 3+7 words, etc, as long as the first and second storage locations allocated to the items remain aligned on an eight-word address boundary within each bank, assuming the burst length parameter BL is set to eight words.

FIG. 8A shows the optimum order of the four access steps when the information items R and W of FIG. 6A are of length ten words and are split symmetrically (5+5 words) across the two banks. FIG. 8B shows the optimum sequence of the four access steps when the information items W and R are each of length ten words, but the split is asymmetrical, with the first part of each item (the part stored in bank 0) being six words in length and the second part (stored in bank 1) being four words in length, i.e. shorter than the first part.

In each case, the optimum sequence remains (as in FIG. 6B): ① write W1 to bank 0; ② read R2 from bank 1; ③ write W2 to bank 1; ④ read R1 from bank 0.

As can be seen from a comparison of FIGS. 8A and 8B, the throughput is the same in each case (the next activate command to either bank can be issued in clock cycle 24. However, whilst this is the case for the particular 6+4 asymmetrical split between banks 0 and 1 illustrated in FIG. 8B, the overall sequence would require one additional clock cycle if the asymmetrical split were the other way round, i.e. a 4+6 word split as between banks 0 and 1 (at least when the sequence of the four steps is ① write W1 to bank 0 (four words), ② read R2 from bank 1 (six words), ③ write W2 to bank 1 (six words), ④ read R1 from bank 0 (four words)). It is generally preferable to finish the overall sequence with the longest read burst possible, so as to hide any write-sequence end effects.

Although throughput requirements may be the main design consideration, two further considerations may influence the type of split bank storage chosen (symmetrical or otherwise). Whatever split is chosen, if either part of the information item is greater than four words in length, the storage locations of each bank will have to be aligned in blocks of eight words. Thus, in the case of a 10-word long information item, a 5+5 split will leave three words in each block unused, whereas a 6+4 or a 4+6 split will leave a block of four words unused in one of the banks, and these spare four words could possibly be utilised for other purposes and accessed efficiently (in a burst of four words). In addition, it will be seen from a comparison of FIGS. 8A and 8B that the commands R1a and W1c of FIG. 8A are not required in FIG. 8B because in FIG. 8B the read bank 1 and write bank 1 steps are accomplished by a single burst of four words. Thus, the number of commands or addresses supplied to the SDRAM device is reduced in the asymmetrical 6+4 (or 4+6) case, which can allow reduced design complexity or allow additional sequence flexibility.

Figure 9:
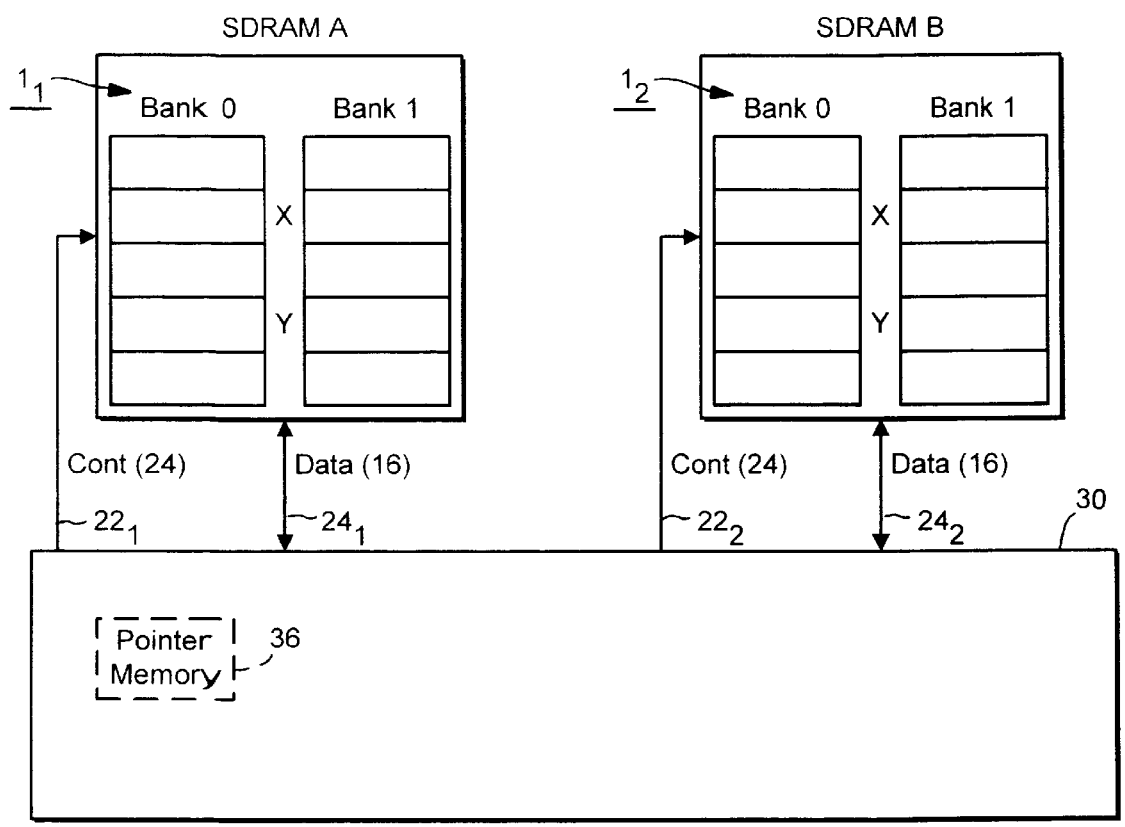
FIG. 9 shows parts of a SDRAM memory system according to a second embodiment of the present invention.

FIG. 9 shows a SDRAM memory system according to a second embodiment of the present invention. This system includes first and second SDRAM devices $1_1$ (SDRAM A) and $1_2$ (SDRAM B), each having first and second banks (banks 0 and 1). Each SDRAM device $1_1$ or $1_2$ may be an SDRAM device as shown in FIG. 1. The system also includes a memory access device 30 including a pointer memory 36. The memory access device 30 has a first interface connected to the first SDRAM $1_1$ by way of a control bus $22_1$ and a data bus $24_1$, and a second interface connected to the SDRAM device $1_2$ by way of a further control bus $22_2$ and a further data bus $24_2$. The memory access device 30 is generally similar to the memory access device 20 of the first embodiment (FIG. 4), but the pointer memory 36 in the second embodiment is of a different configuration from the pointer memory 26 of the first embodiment.

A memory access method embodying the third aspect of the present invention, for use in the FIG. 9 memory system, will now be explained with reference to FIGS. 10A to 10D. In this method, each information item is allocated 4 different storage locations in different respective banks, the first storage location being in bank 0 of SDRAM A (referred to as bank A0 hereinafter), the second storage location being in bank 1 of SDRAM A (bank A1), the third storage location being in bank 0 of SDRAM B (bank B0), and the fourth storage location being in bank 1 of SDRAM B (bank B1).

For example, information item I1 is allocated a first storage location W in bank A0 (hereinafter "A0W"), a second storage location W in bank A1 ("A1W"), a third storage location W in bank B0 ("B0W") and a fourth storage location W in bank B1 ("B1W").

Figure 10A:
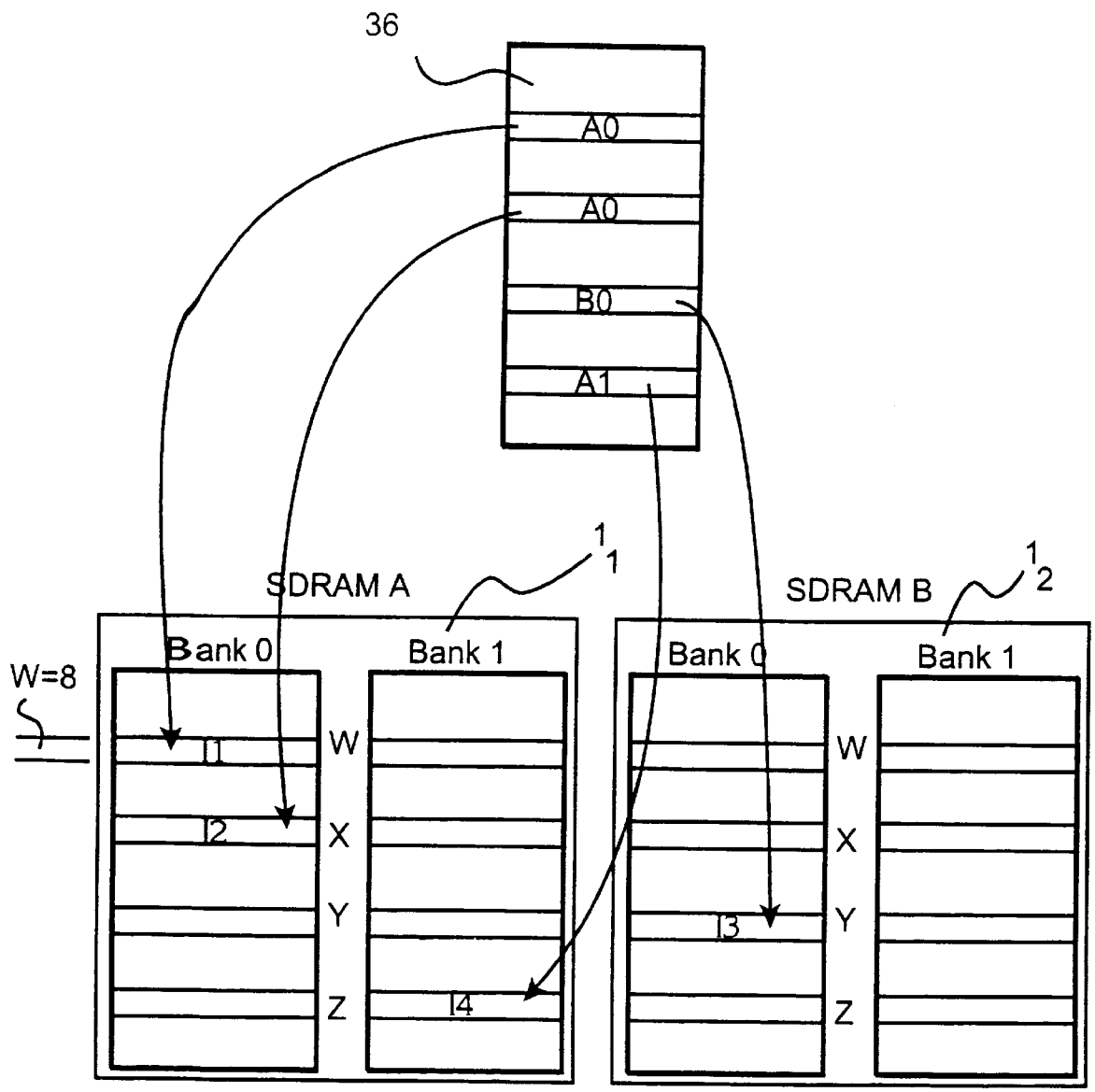
FIGS. 10A to 10D show respective diagrams for use in explaining a memory access method embodying the aforesaid third aspect of the present invention.

At any given time, only one of the four allocated storage locations holds the information item. Thus, in this case, the pointer memory 36 needs to be made up of two bits per information item to indicate that one of the four allocated storage locations which currently hold the item. When, as shown in FIG. 10A, respective information items I1 and I2 are currently stored in the first storage location allocated to them, the pointer memory entries P1 and P2 corresponding to these items each indicate "A0". Similarly, when, as shown in FIG. 10A, a third information item I3 is stored in the third storage location allocated to that item, the pointer memory entry P3 for that item indicates "B0".

Figure 10B:
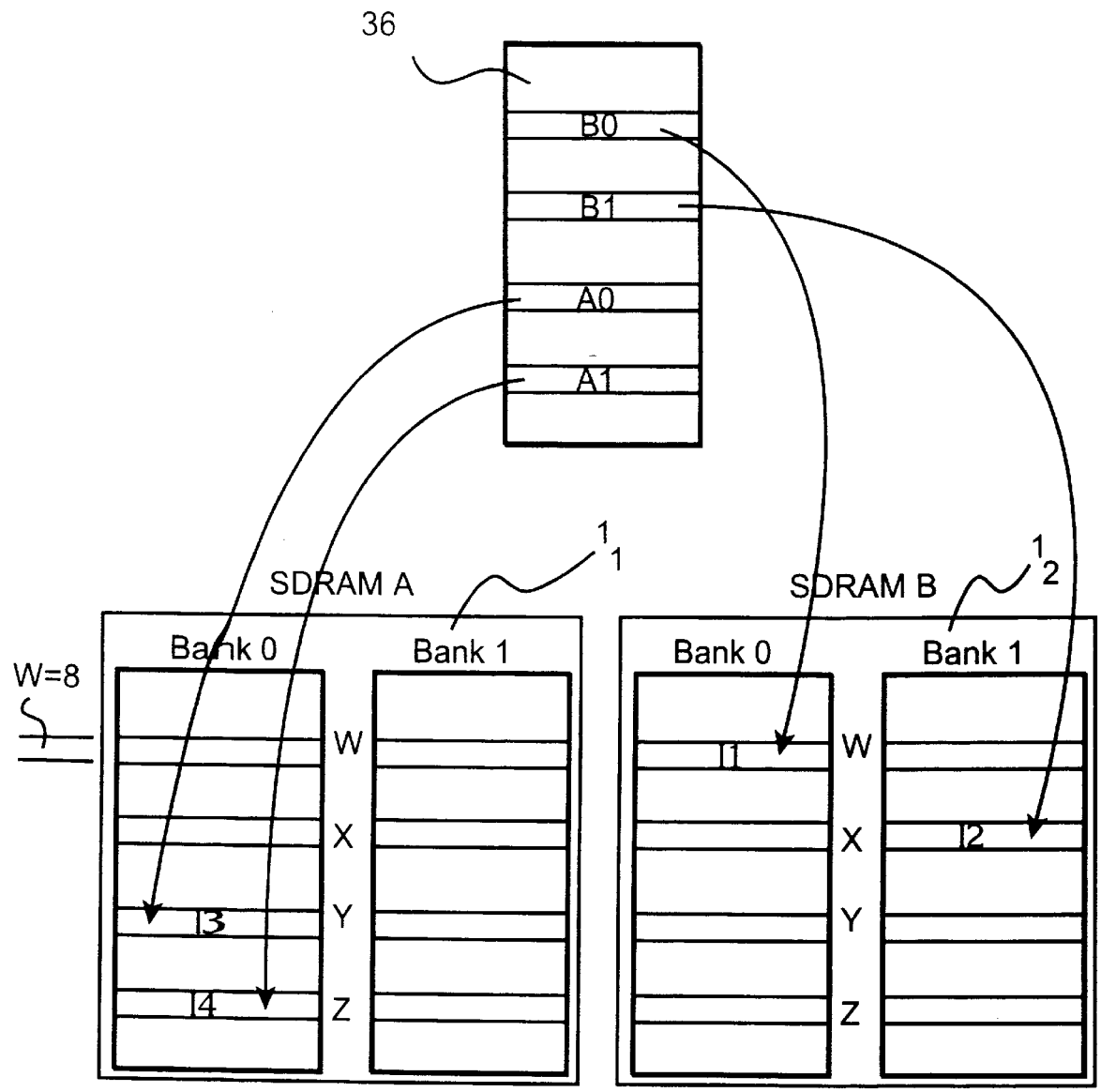
Figure 10C:
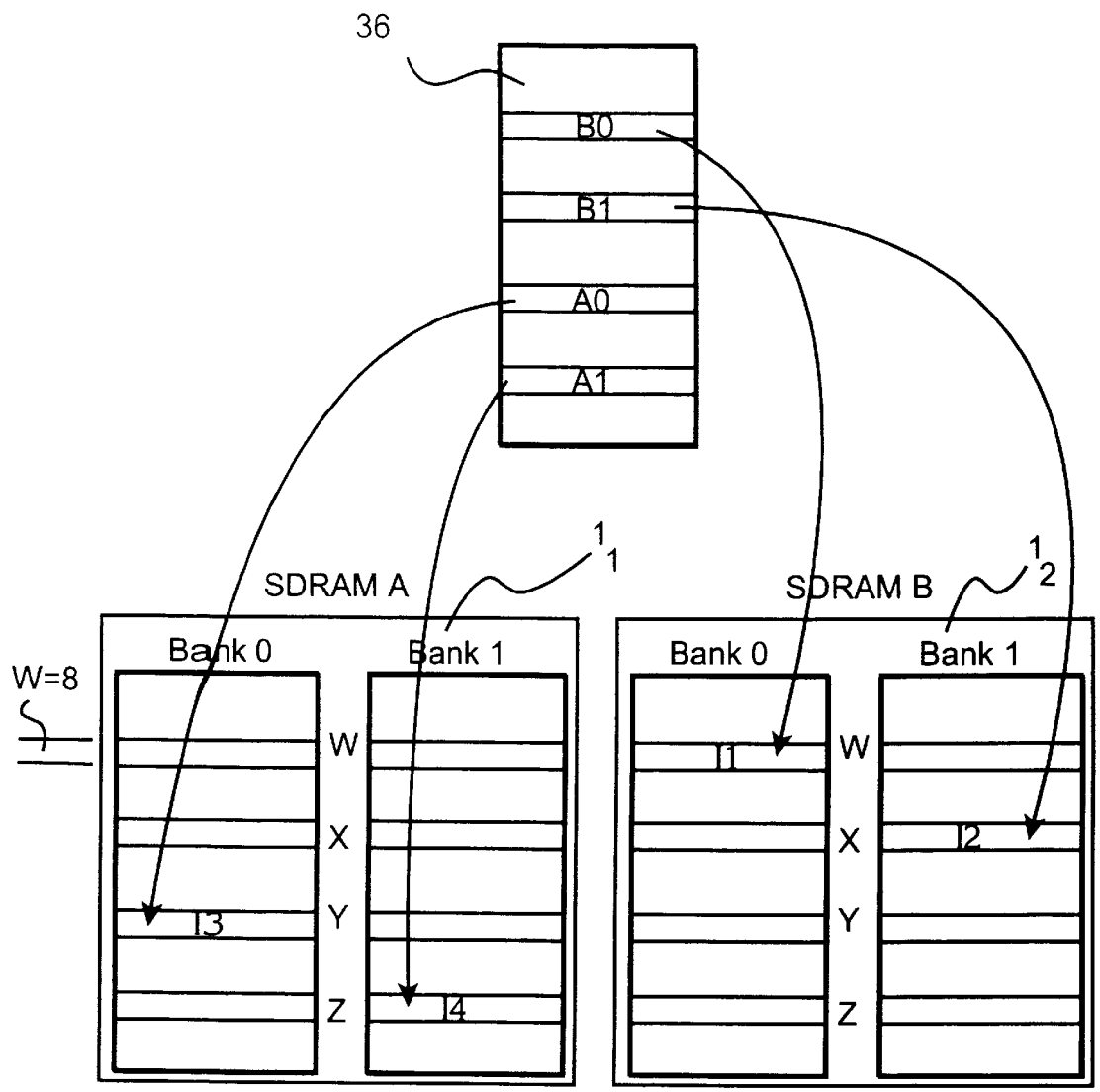
Figure 10D:
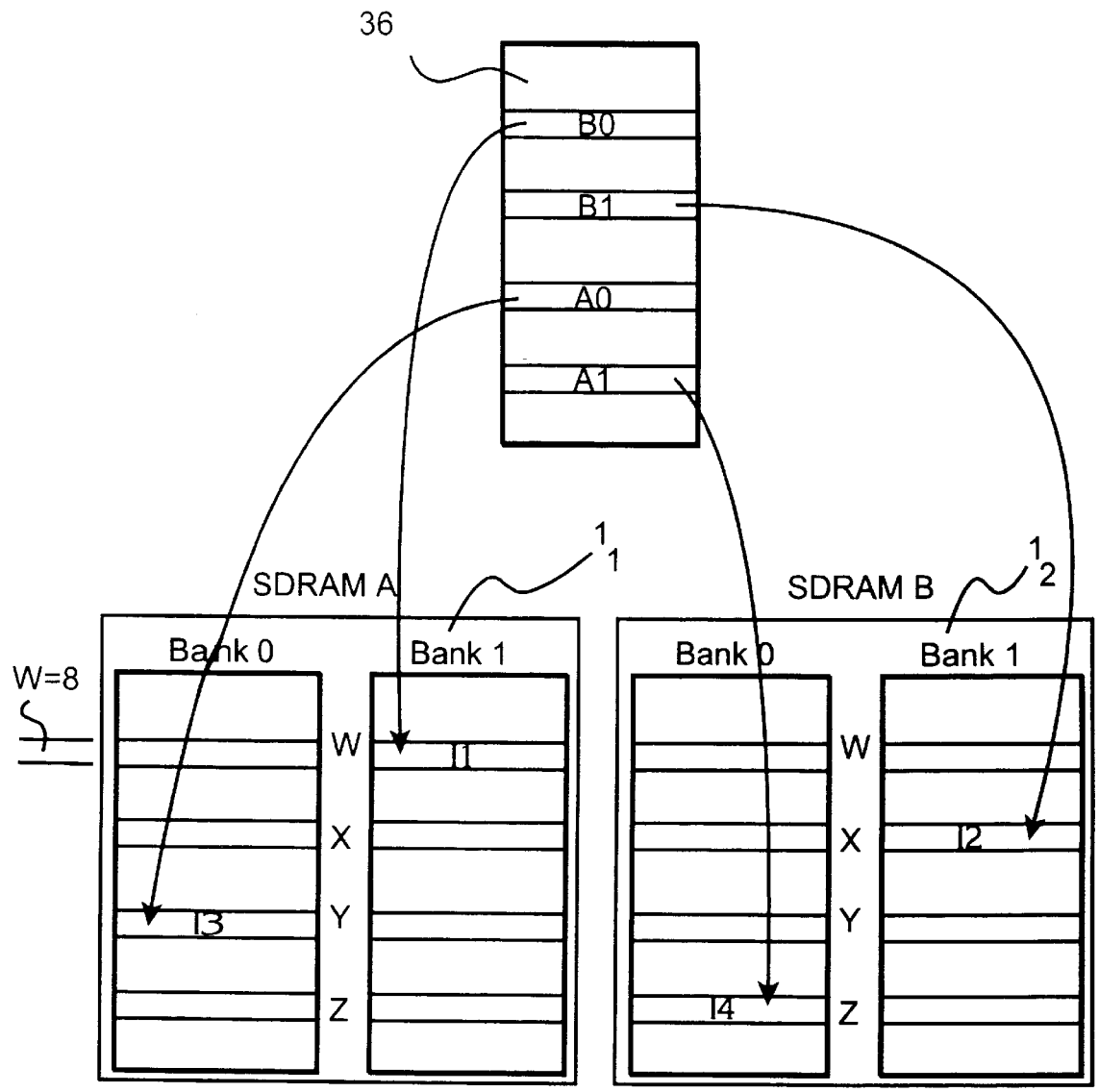

The present "quad bank" access method is intended to enable two information items to be read and two information items to be written in the same timeslot. In FIGS. 10B to 10D it is assumed that the two information items to be read are items I3 and I4 and that the two items to be written are I1 and I2.

In the first step of the method it is determined, using the pointer memory entries P3 and P4 corresponding to the items I3 and I4 to be read, which bank or banks presently hold those items. Depending on the results of the determination, the access combinations (i.e. the two reads and the two writes) fall into one of three different categories as set out in Table 1 below.

TABLE 1

| Case | Reads | Writes | Explanation |
|---|---|---|---|
| 1 | A0Y (I3) | B0W (I1) | Item reads are from same bank in SDRAM A |
|  | A0Z (I4) | B1X (I2) | Item writes are to different banks in SDRAM B |
| 2 | A0Y (I3) | B0W (I1) | Item reads are from different banks in SDRAM A |
|  | A1Z (I4) | B1X (I2) | Item writes are to different banks in SDRAM B |
| 3 | A0Y (I3) | A1W (I1) | Item reads are from different SDRAMs |
|  | B0Z (I4) | B1X (I2) | Item writes are to other banks in both SDRAMs |

Figure 11A:
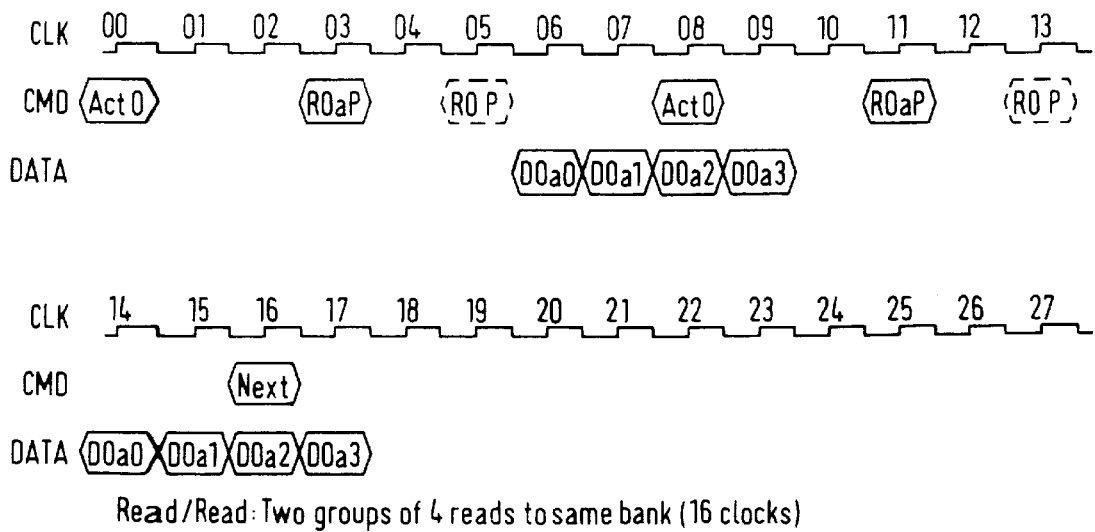
FIGS. 11A to 11D show timing diagrams relating to the method of FIGS. 10A to 10D.
Figure 11B:
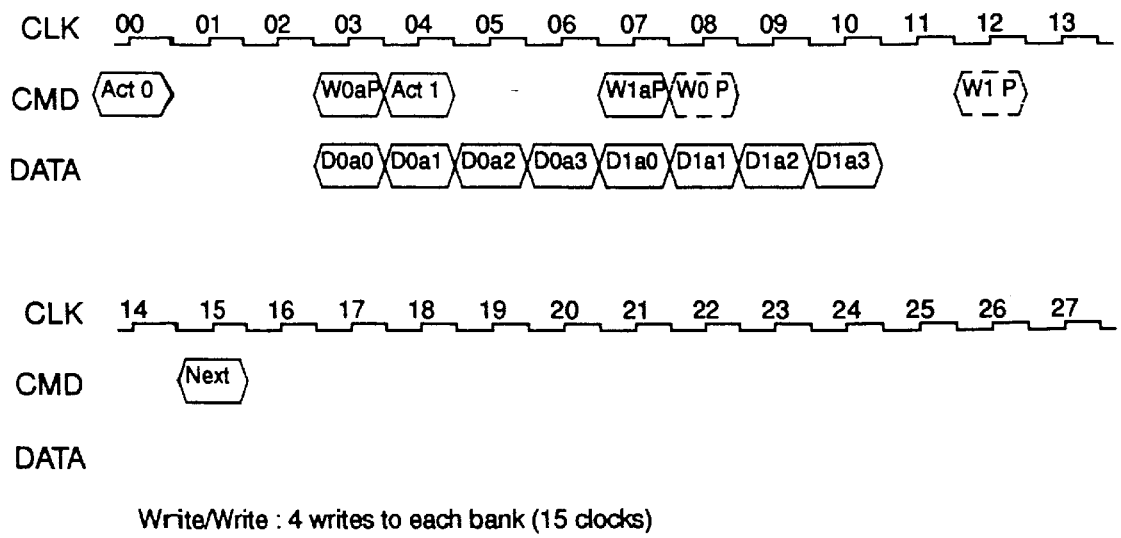

In case 1, which is represented in FIG. 10B, the two items I3 and I4 to be read are held in the same bank (bank 0 in this example) of SDRAM A. In this case, in the timeslot concerned, SDRAM A must perform two consecutive reads from the same bank (bank 0). A timing diagram illustrating the two consecutive reads in SDRAM A is shown in FIG. 11A. In parallel with these two consecutive reads in SDRAM A, the two items I1 and I2 to be written are written in different respective banks of SDRAM B, as shown in FIG. 10B. These two consecutive write operations are illustrated in the timing diagram of FIG. 11B. The two consecutive reads in SDRAM A take slightly longer (16 clock cycles) than the two consecutive writes to different banks of SDRAM B (15 clock cycles) as shown in FIG. 11B, so that the overall operation is completed at the beginning of clock cycle 16.

Figure 11C:
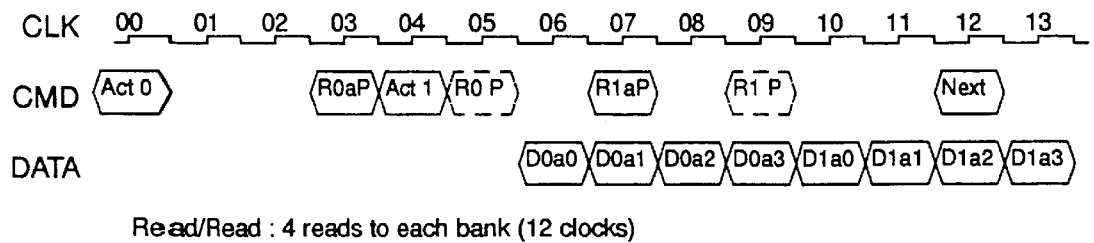

In case 2, which is illustrated in FIG. 10C, the two items I3 and I4 to be read are in different banks of SDRAM A. The two reads are performed consecutively in SDRAM A as shown in FIG. 1C. In parallel with the two read operations, the items I1 and I2 are written to different respective banks of SDRAM B, as shown in FIG. 11B. In this case the two consecutive writes of FIG. 11B take longer (15 clock cycles) than the two consecutive reads (12 clock cycles) of FIG. 11C, so that the overall operation is completed by the beginning of clock cycle 15.

Figure 11D:
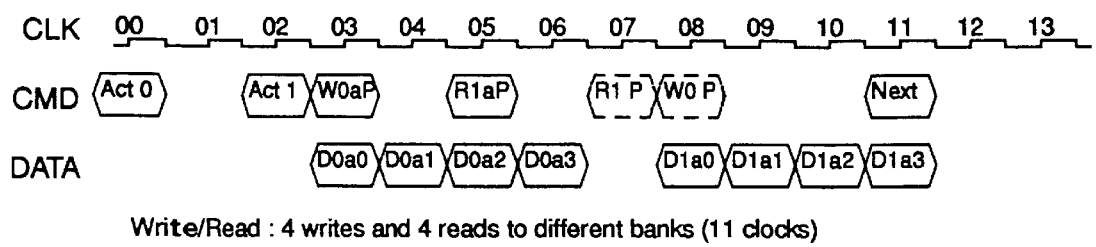

In case 3, which is illustrated in FIG. 10D, the two items I3 and I4 to be read are in different respective SDRAMs, I3 being in bank A0 and I4 being in bank B0. In this case, in SDRAM A item I1 is written to bank 1 before I3 is read from bank 0. In parallel with these operations in SDRAM A, in SDRAM B I2 is written to bank 1 before I4 is read from bank 0. The related timing diagram shown in FIG. 11D. The overall operation is completed after 11 clock cycles.

In each SDRAM, the two accesses can be forced to be to two different banks (except in the situation where two reads must be performed on the same bank, as in case 1, which fortunately does not usually cause an unacceptable overhead), so that the bank swapping overheads can be hidden.

When the information items are of length four words, the "case 1" access combination of Table 1 takes the longest time.

It will be appreciated that the memory utilisation in the memory access method embodying the third aspect of the invention is only 25%. However, this method does enable very high bandwidths to be achieved.

If the information items are longer than approximately four words each (and certainly if they are eight words in length), it is worthwhile to combine the split bank method described previously with reference to FIGS. 6A and 6B with the FIG. 10A quad bank data structure.

In this combined method, each information item is (as in FIG. 10A) allocated four different storage locations in different respective banks (A0, A1, B0 and B1). The first and second storage locations allocated to each information item, i.e. the two storage locations in SDRAM A, are treated as a first pair of storage locations, and the third and fourth storage locations allocated to each item, i.e. the two storage locations in SDRAM B, are treated as a second pair of storage locations.

An information item is split into first and second parts, and the first and second parts of the item are stored respectively in the two storage locations of the first pair or in the two storage locations respectively of the second pair. Thus, each information item is either stored entirely within the first pair of storage locations allocated to it or entirely within the second pair of storage locations allocated to it, so that in the present embodiment the pointer memory 36 requires only a single bit per information item to identify the storage-location-pair (i.e. the SDRAM device A or B), which currently holds the item concerned.

Figure 12A:
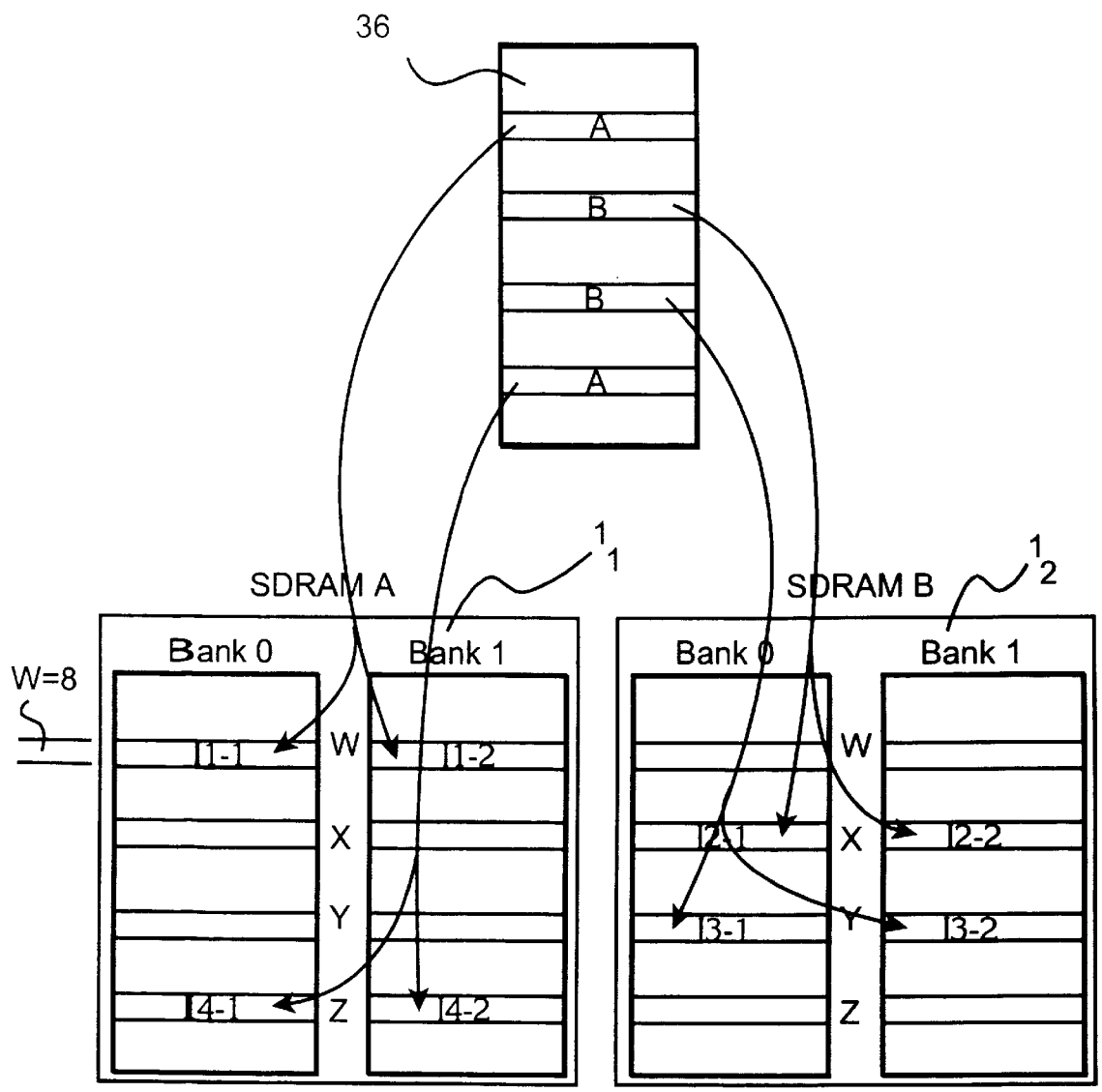
FIGS. 12A to 12C show respective diagrams for use in explaining a memory access method embodying the aforesaid fourth aspect of the present invention.
Figure 12B:
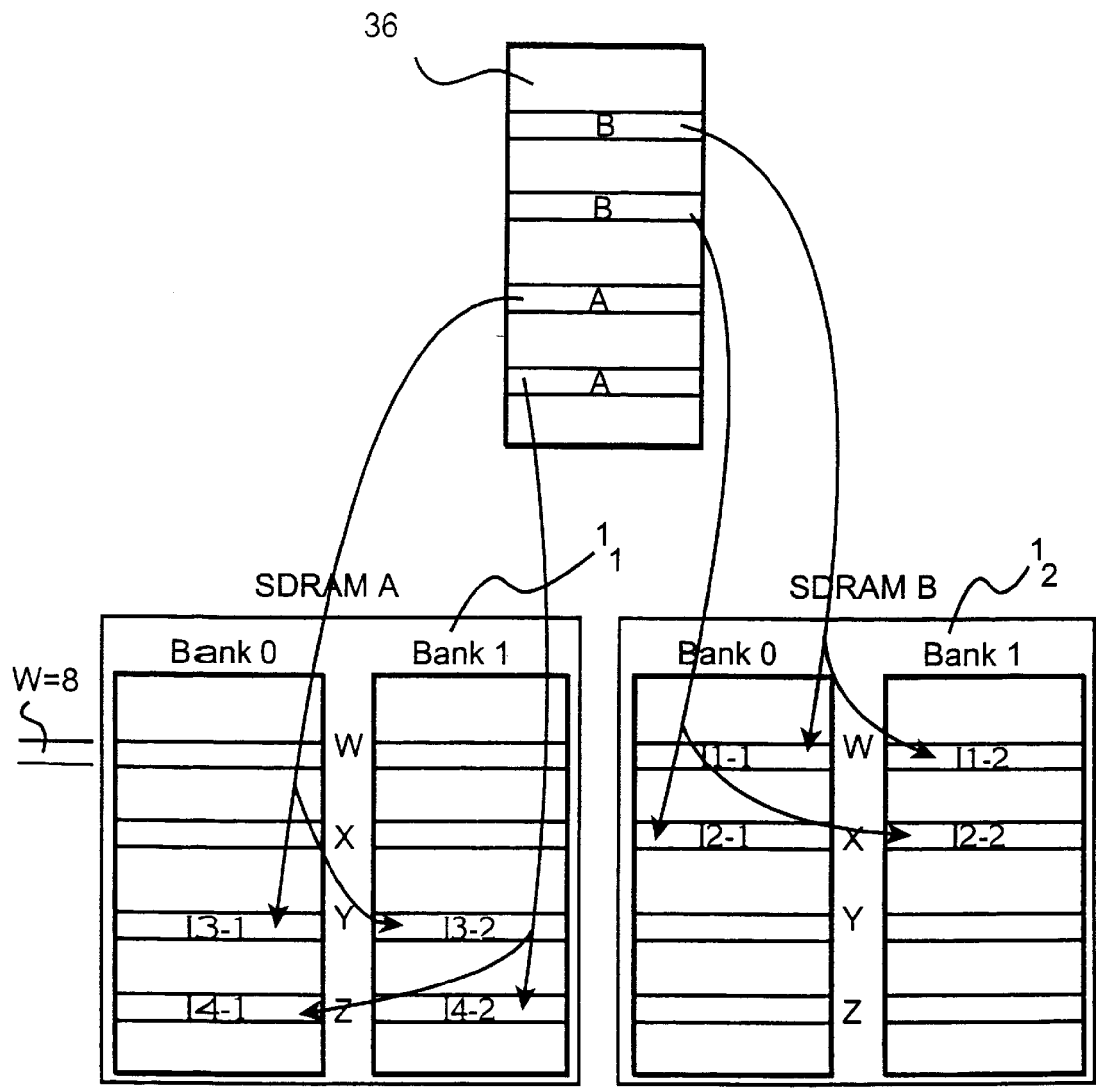
Figure 12C:
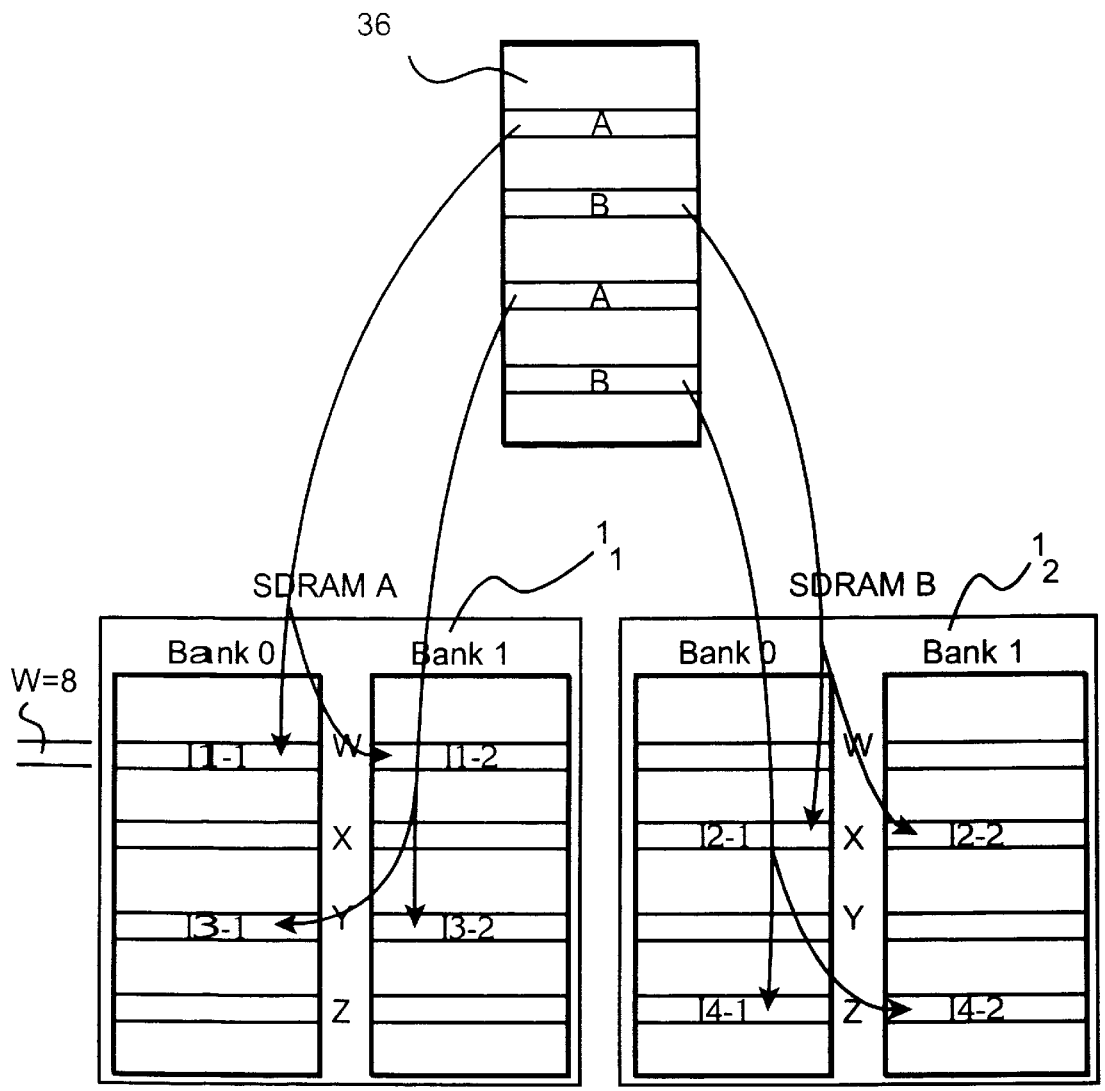

The storage organisation is shown in FIG. 12A. In the FIG. I1-1 denotes the first part of information item I1, and I1-2 denotes the second part of information item I1, etc.

The access method proceeds as follows. Firstly, it is determined, using the pointer memory entries P3 and P4 corresponding respectively to the two information items I3 and I4 to be read, in which storage-location pair or pairs those two items are currently stored. In dependence upon this determination, the method continues in accordance with case (a) or case (b) of Table 2 below.

TABLE 2

| Case | Reads | Writes | Explanation |
|---|---|---|---|
| (a) | A0Y (I3-1) | B0W (I1-1) | Item reads are both from SDRAM A |
|  | A1Y (I3-2) | B1W (I1-2) | Item writes are both to SDRAM B |
|  | A0Z (I4-1) | B0X (I2-1) |  |
|  | A1Z (I4-2) | B1X (I2-2) |  |
| (b) | A0Y (I3-1) | A0W (I1-1) | Item reads are from different SDRAMs |
|  | A1Y (I3-2) | A1W (I1-2) | Item writes are to different SDRAMs |
|  | B0Z (I4-1) | B0X (I2-1) |  |
|  | B1Z (I4-2) | B1X (I2-2) |  |

In case (a) the items I3 and I4 to be read are both stored in SDRAM A, and so in this case the following sequence of four read operations is carried out in SDRAM A.

① Read I3 from SDRAM A: [ read A0Y and prepare to read A1Y
②                          [ read A1Y and prepare to read A0Z
③ Read I4 from SDRAM A: [ read A0Z and prepare to read A1Z
④                          [ read A1Z These four read operations from SDRAM A require 20 clock cycles in total.

In parallel with the four read operations from SDRAM A, four consecutive write operations are carried out in SDRAM B as follows:

① Write I1 to SDRAM B: [ write B0W and prepare to write B1W
②                         [ write B1W and prepare to write B0X
③ Write I2 to SDRAM B: [ write B0X and prepare to write B1X
④                         [ write B1X The writes to SDRAM B require 22 clock cycles to complete bank 0 operations and 26 clock cycles to complete bank 1 operations. As the present memory access method always starts any set of split bank operations (within a particular timeslot) with a bank 0 operation (in case bank 1 has not completed its operations from the previous time slot) the shorter (bank 0) number of clock cycles (22 clock cycles) can be used.

In case (b) of Table 2, the two items I3 and I4 to be read are currently held in different SDRAMs, so that in this case in each SDRAM one information item is read and one information item is written. The sequence of operations in SDRAM A is as follows:

① Read I3 from SDRAM A: [ read A0Y and prepare to read A1Y
②                        [ read A1Y and prepare to write A0W
③ Write I1 to SDRAM A: [ write A0W and prepare to write A1W
④                        [ write A1W In parallel with these operations in SDRAM A, in SDRAM B, the following sequence of operations is carried out:

① Read I4 from SDRAM B: [ read B0Z and prepare to read B1Z
②                        [ read B1Z and prepare to write B0X
③ Write I2 to SDRAM B: [ write B0X and prepare to write B1X
④                        [ write B1X Each of the sequences carried out in SDRAM A and B (R0, R1, W0, W1) requires 23 clock cycles to complete bank 0 operations, and 27 clock cycles to complete bank 1 operations. Thus, the worst case in the present method is case (b) which requires 23 clock cycles as compared to 22 clock cycles in case (a). If it is desired to be able to complete the operations in case (b) more quickly (so that case (a) becomes the worst case), the following sequence can be performed in SDRAM A:

① Write I1-1 to SDRAM A: write A0W and prepare to read A1Y
② Read I3-2 from SDRAM A: read A1Y and prepare to write A1W
③ Write I1-2 to SDRAM A: write A1W and prepare to read A0Y
④ Read I3-1 from SDRAM A: read A0Y In parallel with these operations in SDRAM A, in SDRAM B the following operations are performed:

① Write I2-1 to SDRAM B: write B0X and prepare to read B1Z
② Read I4-2 from SDRAM B: read B1Z and prepare to write B1X
③ Write I2-2 to SDRAM B: write B1X and prepare to read B0Z
④ Read I4-1 from SDRAM B: read B0Z Each of the above sequences carried out in SDRAMs A and B corresponds to the sequence shown in FIG. 7 and requires 20 clock cycles to complete. These sequences are faster than the sequence of four writes (to SDRAM B) in case (a) in Table 2.

The memory access method embodying the fourth aspect of the invention is preferable from a storage efficiency point of view (the memory utilisation is potentially 50%, which is considerably better than 25% for the quad bank method of FIGS. 10A to 10D), provided that any decrease in overall performance (as compared to the quad bank method) can be tolerated. The performance may decrease due to the effective burst length per bank being halved when compared to the corresponding quad bank method.

Figure 13:
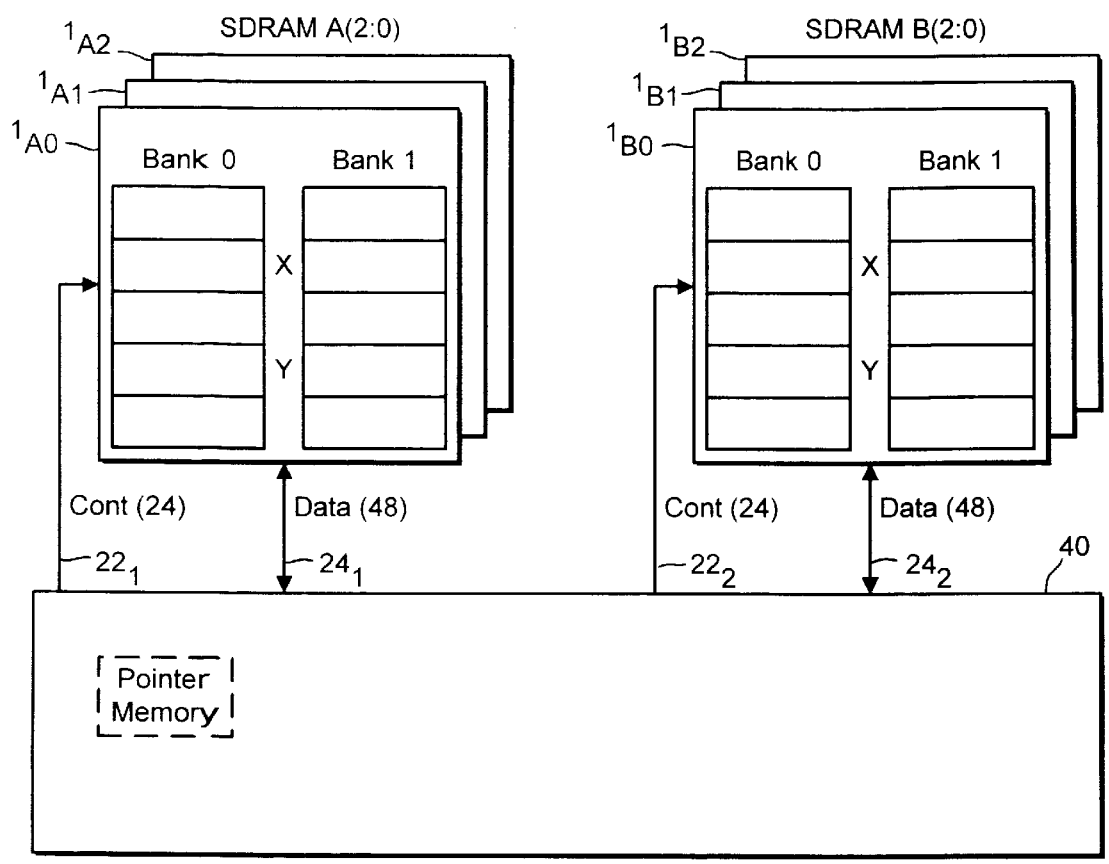
FIG. 13 shows a SDRAM memory system according to a third embodiment of the present invention.

FIG. 13 shows parts of an SDRAM memory system according to a third embodiment of the present invention. In this system a memory access device 40 has two memory interfaces, each interface having three 16-bit wide SDRAM devices $1_{A0}$ to $1_{A2}$ or $1_{B0}$ to $1_{B2}$ connected to it by way of a common control bus $22_1$ or $22_2$, for example of 24 signals including a clock signal and an address signal, and a data bus of 48 bits. Each SDRAM device $1_{A0}$ to $1_{A2}$ and $1_{B0}$ to $1_{B2}$ may be an SDRAM device as shown in FIG. 1.

The memory access methods and devices embodying the aforesaid first to eighth aspects of the present invention can each be implemented by the FIG. 13 SDRAM memory system. Where these methods and devices involve access to two banks, using the FIG. 13 apparatus the two banks can exist conceptually at three different levels:

within the same SDRAM device (e.g. in device $1_{A0}$ banks 0 and 1);

within the same interface (e.g. the respective banks 0 in the devices $1_{A1}$ and $1_{A0}$); and across different interfaces (e.g. the respective banks 0 in devices $1_{B0}$ and $1_{A0}$).

In the SDRAM memory system shown in FIG. 13, each SDRAM device has its own individual chip select signal, which is the only signal which needs to be operated at the maximum clock frequency of the memory system. When the chip select signal of a particular SDRAM device is inactive, the device does not react to commands supplied to it on other signal lines of the control bus $22_1$ or $22_2$. Thus, by using individual chip select signals to control multiple devices connected to an otherwise common control bus, the operations described below become possible, increasing the flexibility of the memory system.

In one mode of operation of the FIG. 13 memory system, wide banks (greater than 16 bits) can be created by operating several individual SDRAM devices in parallel. In view of the high operating frequencies required in high-performance applications, it is unlikely that more than four individual SDRAM devices (and probably only three such devices) can be driven satisfactorily from a single control bus $22_1$ or $22_2$. This therefore restricts the maximum data rate (for 16 bit-wide devices) to 48 or 64 bits per data transfer cycle.

Generally, data transfer cycles will account for around 67% of elapsed clock cycles for burst sizes of less than eight words. However, some improvement on this figure can be achieved by adopting the memory access methods embodying the aforesaid first to fourth aspects of the present invention.

In another possible mode of operation of the FIG. 13 memory system, the devices connected to the same control bus are operated individually (using individual chip select signals) so as to give the effect of having additional banks of memory on the interface concerned. For example, in one implementation of memory apparatus embodying the ninth aspect of the invention, the SDRAM devices $1_{A1}$ and $1_{A2}$ could be operated in parallel (so that banks 0 and 1 can then be considered to each be of 32-bit width), whilst the SDRAM device $1_{A0}$ could be operated separately (providing two additional banks of 16-bit wide memory, which can be considered as banks 2 and 3 of the interface A).

Furthermore, the SDRAM device $1_{A0}$ can be configured independently from the other two devices $1_{A1}$ and $1_{A2}$ belonging to the same interface. For example, the wide banks 0 and 1 provided by the devices $1_{A1}$ and $1_{A2}$ could have a burst length of four words, whilst the narrow banks 2 and 3 provided by the device $1_{A0}$ could have a burst length of eight words.

Alternatively, or in addition, in an embodiment of a tenth aspect of the present invention the SDRAM devices $1_{A0}$ to $1_{A2}$ belonging to the same interface could be a mixture of different-size-bank devices, for example the device $1_{A0}$ could have four-bit-wide banks; the device $1_{A1}$ could have eight-bit-wide banks; and the device $1_{A2}$ could have sixteen-bit-wide banks.

The only restriction to the flexibility mentioned above is that vacant cycles must exist on the common control bus $22_1$ or $22_2$ to utilise the available banks.

According to an embodiment of an eleventh aspect of the present invention, it is possible to connect more than three or four individual SDRAM devices to the common control bus $22_1$ or $22_2$ of FIG. 13 so as to provide very wide banks (greater than 48 or 64 bits). This results in the address and control signals being heavily loaded such that they may be unable to meet the timing requirements at the chosen operating frequency. However, the SDRAM devices can still be operated correctly in such a situation if the control signals are allowed more than one clock period to reach their correct electrical levels. In this case, the individual chip select signals must still operate at the full chosen operating frequency, and are used to deactivate the SDRAM devices while the other signals are settling. Once a command is supplied to a SDRAM device, it will be executed normally, even if the chip select signal for that device is subsequently deactivated.

The penalty for this mode of operation is that each command issued to a SDRAM then requires more than one clock cycle, which may lead to delays in issuing the command due to congestion on the control bus.

FIG. 14 shows an example of bank-interleaved write and read operations in a memory system having four or more individual SDRAM devices operating in parallel. The FIG. 14 sequence can be compared with the similar bank-interleaved write and read operations shown in FIG. 3B. In the FIG. 3B example only a single SDRAM device is connected to an interface of the access control device, as shown in FIG. 4.

In the FIG. 14 example sequence, each command (activate bank 0, activate bank 1, write to bank 1 with auto precharge, and read from bank 0 with auto precharge) occupies two clock cycles, and the chip select signal CS is used to deactivate the SDRAM devices whilst the command signals are settling. If command clashes can be avoided (by using longer bursts) this method is viable and reduces control pin counts.

The memory access methods set out above, although described in particular relation to SDRAM devices, are applicable much more widely to virtually any random access memory system.

For example, there are many types of random access memory device or unit which have, internally, two or more different storage portions but externally these two or more storage portions must be accessed via a common or shared data line or bus. For example, Rambus and SyncLink devices have two or more memory banks internally which are accessed, externally of the device, using a common data bus. Similarly, some disk drive units may include, within the unit, two or more data storage surfaces (magnetic or optical; and hard or floppy) which are independently-accessible (i.e. a separate read/write head is provided for each data storage surface) but the unit uses a common data bus for access to the two data storage surfaces. In all of these cases, the common data bus represents a "data bottleneck" such that, when it is required to carry out a read operation and a write operation in the same timeslot, the data of the read operation must not be present on the data bus at the same time as the data of the write operation. Because the two operations are carried out on different storage portions in the memory access methods described above (different banks in the case of SDRAM, Rambus or SyncLink devices, and different data storage surfaces in the case of a disk drive unit) the benefits of interleaved access (i.e. making it possible to hide some of the protocol sequences needed at the beginning and the end of the access operations) are attained, leading to an increase in throughput. It is irrelevant what type of random access memory storage is used.

A memory access method embodying the first aspect of the present invention is applicable advantageously to random access memory systems which have two or more storage portions that do not share a common data bus but have different respective data buses. In this case, each information item can be allocated a first storage location in a first storage portion and a second storage location in a second storage portion of the random access memory system. The first and second storage portions could be provided by different respective semiconductor random access memory devices (e.g. static RAMs-SRAMS, dynamic RAMs—DRAMs, SDRAMs, Rambus devices, or SyncLink devices) or by different respective disk-drive-unit data storage surfaces. In the latter case, the two data storage surfaces could be in different respective disk drive units or form part of the same disk drive unit provided that there is parallel access to the data of the two data storage surfaces within the unit.

When the two storage portions can be accessed in parallel and each information item is allocated two storage locations in the two different storage portions respectively, it is possible to guarantee to be able to perform the write operation (on one storage portion) in parallel with the read operation (on the other storage portion). Thus, the throughput can be increased significantly, and the minimum duration of the timeslot (in which one information item is written and another information item is read) is reduced to being equal to the duration of the longer of the two (write and read) access operations.

By way of example, a memory access method embodying the first aspect of the invention will now be described in relation to a random access memory system employing static RAM devices, and a random access memory system employing Rambus memory devices.

Referring to FIG. 15A, a random access memory system includes a first SRAM device $101_A$ (SRAM 0) and a second SRAM device $101_B$ (SRAM 1). In the random access memory system of FIG. 15A, each information item (example items (a) to (d) are shown in FIG. 15A) is allocated a first storage location in SRAM 0 and a second storage location in SRAM 1.

In the random access memory system of FIG. 15A, each individual SRAM device is able to perform a read or a write of, for example, a single data item in a given timeslot (i.e. a clock cycle) but is not capable of doing both a read and a write in that timeslot.

The method proceeds as follows. Data items (a) to (d) are initially held in the two different SRAM devices as shown in FIG. 15A as a result of previous random accesses. It is assumed that the random access memory system is employed in circuitry which processes data on a pipeline basis such that in any given clock cycle there is a need to read one information item from the random access memory system and to write back to the memory an information item read in a previous clock cycle that has been processed and modified in some particular way. In this example, it is assumed that the processing of the data requires just one clock cycle. The technique is applicable, however, irrespective of the number of clock cycles that it takes to process an information item between its reading and its subsequent rewriting.

Referring now to FIG. 15B, the read and write operations are performed as follows:

During Clock 1, read (a) from SRAM0, and write (*) to SRAM1
During Clock 2, read (b) from SRAM0, and write (*) to SRAM1
During Clock 3, read (c) from SRAM1, and write (a) to SRAM0 [as RAM1 is busy]
During Clock 4, read (d) from SRAM0, and write (b) to SRAM1 [as RAM0 is busy]
During Clock 5, read (*) from SRAM*, and write (c) SRAM' [* and ' are different RAMs]

In the random access memory system described above, additional logic is required to cater for the situation where an information item is accessed again before the updated version of it has been returned to one of the memory devices. However, the provision of such additional logic is a well-known problem in the technical field of pipeline processing and so would be well within the routine competence of a person skilled in that field.

Incidentally, although in FIG. 15A the storage locations for items (a) to (d) are shown as being at consecutive addresses, it is of course irrelevant whether or not the addresses of the data items are consecutive.

Figure 16A:
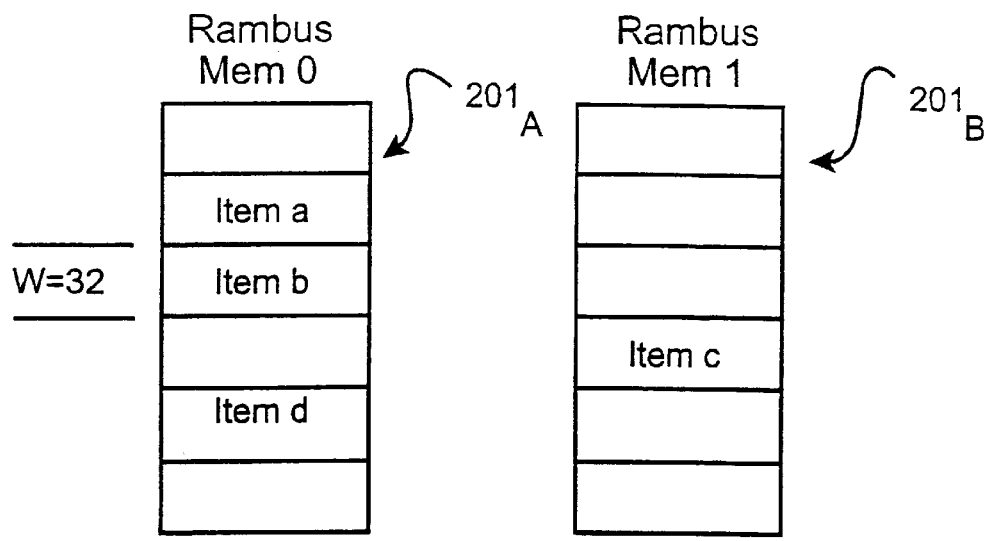
FIGS. 16A to 16C show respective diagrams for use in explaining application of a memory access method embodying the aforesaid first aspect of the present invention to a random access memory system including Rambus devices.

Referring now to FIG. 16A, another random access memory system, including a first Rambus memory device $201_A$ (MEM 0) and a second Rambus memory device $201_B$ (MEM 1), will now be described.

Rambus memories are simply memories that are accessed at very high data rates, using a protocol that requires a relatively high number of clock cycles to initiate the access (even more than an SDRAM device), and where additional clock cycles elapse before the data starts to be transferred. To maintain high effective throughput rates, the size of the data transfer is usually 32 or more bytes. Example devices are the NEC uPD488130L and the Toshiba TC59R0808HK.

Figure 16B:
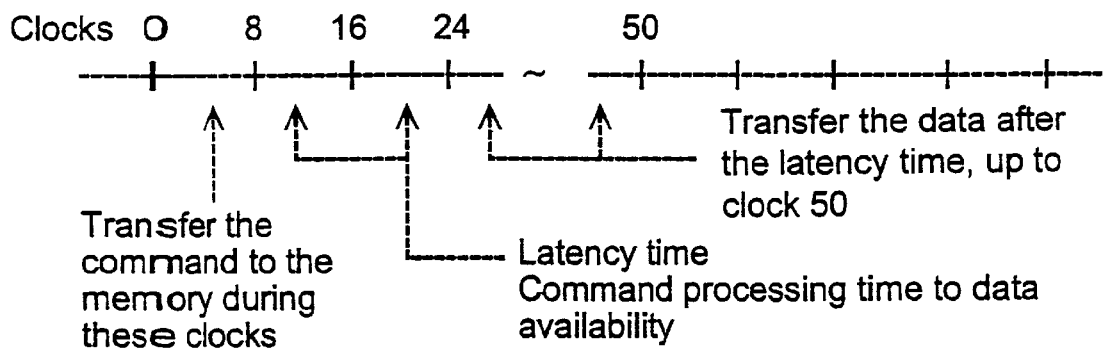

In a Rambus memory device, as shown in FIG. 16B, a data access operation is initiated using a command which is transferred to the device over several clock cycles. Then, there is a latency period of several clock cycles before the data is transferred. Finally, there is the data transfer period itself which follows the latency period and also is of a duration of several clock cycles. In practice, both edges of the clock signal are utilised at all times.

In the Rambus memory system of FIG. 16A, each individual Rambus memory must be able to perform a burst-type read or a burst-type write of an information item in a given time period, but is not capable of doing both such a burst-type read and such a burst-type write in that time period. The information items in this example are assumed to be blocks of 32 words in length, and the time period will be assumed to be 50 clock cycles.

Figure 16C:
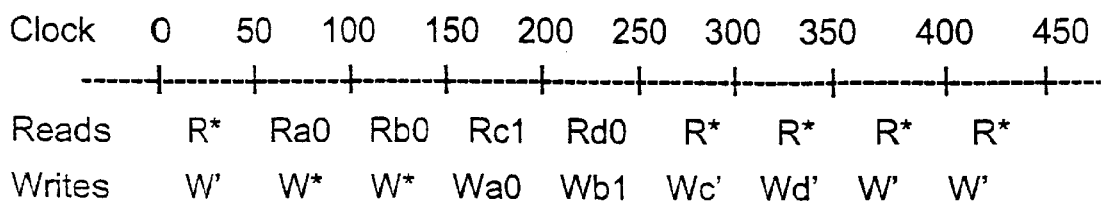

Referring to FIG. 16C, the memory access method in the FIG. 16A memory system proceeds as follows:

During period 1, read (a) from Mem0, and write (*) to Mem1.
During period 2, read (b) from Mem0, and write (*) to Mem1.
During period 3, read (c) from Mem1, and write (a) to Mem0 [as Mem1 is busy].
During period 4, read (d) from Mem0, and write (b) to Mem1 [as Mem0 is busy].
During period 5, read (*) from Mem*, and write (c) to Mem' [* and ' are different Mems].

It is assumed that the pipeline-processing of information items requires 50 clock cycles (one time period). It is irrelevant whether or not the addresses of the information items are consecutive in FIG. 16A. As in the SRAM-based system of FIGS. 15A and 15B, additional logic would be required to cater for the situation where an information item was accessed again before the updated version of it had been returned to one of the memories.

As described above, the "dual bank" strategy described with reference to FIGS. 5A and 5B in relation to SDRAM devices can be usefully applied to any type of random access memory system where an individual memory can sustain the required rate of reads or writes, but not both. The limitation can be caused either by the total time required to complete a transfer (command plus data), which might be alleviated in some cases by interleaving, or simply by the data bandwidth alone. In the latter case, interleaving is insufficient and it is necessary to carry out the read and write operations in parallel on different memory devices (or different data storage surfaces in case of a disk drive), as illustrated by FIGS. 15A and 15B and FIGS. 16A to 16C, to achieve the necessary throughput.

Similarly, although the memory access methods of FIGS. 6A/6B, 8A, 8B, 10A to 10D and 12A to 12C have been described above in relation to random access memory systems based on SDRAM devices, it will be appreciated that the methods concerned can advantageously be applied to random access memory systems based on other types of storage device which have the same limitation as SDRAM devices, namely that, although plural storage portions (banks) are provided within each device, only a common data bus is available for accessing the data of the two storage portions of the device. This limitation applies to Rambus memory devices and SyncLink memory devices. It also applies to disk-based storage units in which there are at least two data storage surfaces (magnetic or optical; hard or floppy) which share a common data bus constituting a "data bottleneck". In all such "data-bottlenecked" random access memory systems, the memory access methods described hereinbefore can usefully be applied to permit access to the storage portions on an interleaved basis and/or on a parallel basis, wherever possible. The appended claims are to be interpreted accordingly.

What is claimed is:

1. A memory access method, for use with a random access memory that has first and second storage portions accessible via a common data bus and that has at least one type of access operation involving a predetermined protocol sequence before and/or after data of the operation is transferred via the common data bus, which method comprises:

allocating each information item respective first and second storage locations in said memory, which first and second locations are in said first and second storage portions respectively;

determining, when a first such information item is to be written in the memory and a second such information item is to be read out from or written in the memory, which of the first and second storage locations allocated to the second information item is to be accessed;

carrying out a first access operation in which the first information item is written in the first storage location allocated thereto if the determined storage location is such a second storage location and in which the first information item is written in the second storage location allocated thereto if the determined storage location is such a first storage location;

carrying out a second access operation in which the second information item is read out from or written in the determined storage location; and controlling the relative timing of the first and second access operations such that for at least one of the two access operations, which involves such a protocol sequence, its said protocol sequence overlaps at least partially with transfer, via said common data bus, of data of the other of the two access operations.

2. A method as claimed in claim 1, wherein said second access operation is a read operation and the determined storage location is that one of the first and second storage locations allocated to the second information item which currently holds that item.

3. A method as claimed in claim 1, wherein each of the first and second access operations involves such a predetermined protocol sequence before and/or after its said data transfer.

4. A method as claimed in claim 3, wherein, for each of said first and second access operations, said predetermined protocol sequence of the access operation overlaps at least partially with said data transfer of the other of the two access operations.

5. A method as claimed in claim 3, wherein said relative timing is controlled such that the respective protocol sequences of the first and second access operations also overlap one another at least partially.

6. A method as claimed in claim 3, wherein:

one of the first and second access operations has a leading such protocol sequence before its said data transfer and the other of those two access operations has a trailing such protocol sequence after its said data transfer; and said relative timing of the first and second access operations is controlled such that in a first phase said leading protocol sequence of said one operation overlaps at least partially with said data transfer of said other operation and, in a second phase following said first phase, said trailing protocol sequence of said other operation overlaps at least partially with said data transfer of said one operation.

7. A method as claimed in claim 6, wherein said one operation also has a trailing protocol sequence after its said data transfer, which trailing protocol sequence is shorter in duration than said leading protocol sequence of the operation.

8. A method as claimed in claim 6, wherein said other operation also has a leading protocol sequence before its said data transfer, which leading protocol sequence is shorter in duration than said trailing protocol sequence of the operation.

9. A method as claimed in claim 6, wherein said leading protocol sequence of said one operation is longer in duration than said data transfer of said other operation, and that data transfer is carried out substantially completely during the course of that sequence.

10. A method as claimed in claim 6, wherein said trailing protocol sequence of said other operation is longer in duration than said data transfer of said one operation, and that data transfer is carried out substantially completely during the course of that sequence.

11. A method as claimed in claim 1, wherein, for at least one of said first and second access operations, the duration of said data transfer is of the same order as the duration of said predetermined protocol sequence.

12. A method as claimed in claim 1, wherein, for at least one of said first and second access operations, the duration of said data transfer is no longer than that of said predetermined protocol sequence.

13. A method as claimed in claim 1, wherein said first and second storage portions are respective banks of the same synchronous dynamic random access memory device.

14. A method as claimed in claim 13, wherein one of the first and second access operations has a leading such protocol sequence before its said data transfer and is a read operation, and the other of those two access operations has a trailing such protocol sequence after its said data transfer and is a write operation.

15. A method as claimed in claim 1, wherein said first and second storage portions are respective banks of the same Rambus or SyncLink device.

16. A method as claimed in claim 1, wherein:

each said information item has a corresponding pointer indicating in which of the first and second storage locations allocated thereto the item concerned is currently held;

the determination of the storage location currently holding said second information item is made using the pointer corresponding to that item; and the pointer corresponding to said first information item is updated to indicate in which of the first and second storage locations allocated thereto the item concerned is written in said first access operation.

17. A memory access method, for use with a random access memory having first and second storage portions that are accessed via a common data bus, which method comprises:

allocating each information item a first storage location for storing a first part of the item and a second storage location for storing a second part of the item, the first and second storage locations being in said first and second storage portions respectively;

in the same time slot, writing a first such information item in the memory and reading a second such information item from the memory by carrying out in a predetermined sequence the operations of a) writing said first part of said first information item in said first storage location allocated to that item; b) writing said second part of said first information item in said second storage location allocated to that item; c) reading said first part of said second information item from said first storage location allocated to that item; and d) reading said second part of said second information item from said second storage location allocated to that item.

18. A method as claimed in claim 17, wherein said first and second storage portions are provided respectively by two different banks of the same synchronous dynamic random access memory device.

19. A method as claimed in claim 17, wherein said predetermined sequence in which said steps (a) to (d) are performed includes at least one pair of successive steps in which the first step of the pair is a write to one of the two storage portions and the second step of the pair is a read of the other of the two storage portions.

20. A method as claimed in claim 19, wherein said sequence is made up of a first such pair of successive operations, followed by a second such pair of successive operations.

21. A method as claimed in claim 20, wherein said sequence is operation (a) followed by step (d) followed by step (b) followed by operation (c).

22. A method as claimed in claim 17, wherein said first and second parts of each information item are of the same length.

23. A method as claimed in claim 17, wherein the length of said first part of each information item is different from the length of said second part of each information item.

24. A method as claimed in claim 23, wherein the last operation of the sequence in which said operations (a) to (d) are performed is the operation of reading the longer of the two parts of said second information item.

25. A method as claimed in claim 23, wherein the length of the shorter of the two parts of each said information item is less than or equal to the number of words that can be accessed in a single burst.

26. A method as claimed in claim 23, wherein the storage location allocated for storing the shorter of the two parts of each information item is longer than that shorter part, and spare words in that storage location are used for storing information other than the information-item part to which that storage location is allocated.

27. A method as claimed in claim 26, wherein the number of spare words is equal to the number of words that can be accessed in a single burst.

28. A memory access method, for use with a random access memory having respective first and second storage portions that are accessed via a first common data bus and also having respective third and fourth banks that are accessed via a second common data bus, which method comprises:

allocating each information item respective first, second, third and fourth storage locations in the first, second, third and fourth storage portions respectively; and in the same time slot, writing first and second such information items in the memory and reading third and fourth such information items from the memory by carrying out the steps of: a) determining which of the storage locations allocated to the third information item currently holds that item and determining which of the storage locations allocated to the fourth information item currently holds that item, and identifying the storage portion(s) in which the two determined storage locations are included; b) writing the first and second information items to respective storage locations in two different storage portions other than the identified storage portion(s); and c) reading said third and fourth information items from their respective determined storage locations.

29. A method as claimed in claim 28, wherein said first and second storage portions are provided respectively by two different banks of a first synchronous dynamic random access memory device, and said third and fourth storage portions are provided respectively by two different banks of a second synchronous dynamic random access memory device.

30. A method as claimed in claim 29, wherein, when it is identified in operation (a) that the determined storage locations for the third and fourth information items are included in different respective banks and that one of those banks forms part of the first synchronous dynamic random access memory device whilst the other of those banks forms part of said second synchronous dynamic random access memory device, in each such device the writing of operation (b), to the bank other than the identified bank of the device concerned, is performed before the reading of operation (c) from that identified bank.

31. A method as claimed in claim 28, wherein:

each said information item has a corresponding pointer indicating in which of said first, second, third and fourth storage locations allocated thereto the item concerned is currently held;

in operation (a), for each of the third and fourth information items, the determination of the storage location currently holding the item concerned is made using the pointer corresponding to that item; and for each of the first and second information items, the pointer corresponding to the item concerned is updated to indicate in which of the first, second, third and fourth storage locations allocated thereto the item concerned is written in operation (b).

32. A memory access method, for use with a dynamic random access memory having respective first and second storage portions that are accessed via a first common data bus and also having third and fourth storage portions that are accessed via a second common data bus, which method comprises:

allocating each information item respective first and second pairs of storage locations, each pair being made up of a first storage location for storing a first part of the item concerned and a second storage location for storing a second part of the item concerned, said first and second storage locations of the first storage-location pair being in the first and second storage portions respectively and said first and second storage locations of the second storage-location pair being in the third and fourth storage portions respectively; and in the same time slot, writing first and second such information items in the memory and reading third and fourth such information items from the memory by carrying out the steps of: a) determining, for each of the third and fourth information items, which of the first and second pairs of storage locations allocated to the item currently holds the item; b) writing the first and second parts of the first information item in the first and second storage locations respectively of the storage-location pair other than the determined storage-location pair for the third information item; c) writing the first and second parts of the second information item in the first and second storage locations respectively of the storage-location pair other than the determined storage-location pair for the fourth information item; d) reading the first and second parts of the third information item from the first and second storage locations respectively of the determined storage-location pair for that item; and e) reading the first and second parts of the fourth information item from the first and second storage location respectively of the determined storage-location pair for that item.

33. A method as claimed in claim 32, wherein said first and second storage portions are provided respectively by two different banks of a first synchronous dynamic random access memory device, and said third and fourth storage portions are provided respectively by two different banks of a second synchronous dynamic random access memory device.

34. A method as claimed in claim 33, wherein, when it is determined that the third and fourth information items are currently held in different respective storage-location pairs, such that in each of said first and second devices one of said writing operations (b) and (c) and one of said reading operations (d) and (e) are to be carried out, the writing operation and reading operation in each device are carried out in the following sequence: writing the first part of the information item to be written in said writing operation reading said second part of the information item to be read in said reading operation; reading said second part of the information item to be read in said reading step; writing the second part of the information item to be written in said writing step; and reading the first part of the information item to be read in said reading step.

35. A method as claimed in claim 33, wherein, when it is determined that the third and fourth information items are both currently held in the same storage-location pair, such that the two reading operations (d) and (e) are both to be carried out in one of the two devices, the two banks of that device are read alternately in the course of carrying out the reading operations (d) and (e).

36. A method as claimed in claim 33, wherein, when it is determined that the third and fourth information items are both currently held in the same storage-location pair, such that the two writing operations (b) and (c) are both to be carried out in one of the two devices, the two banks of that device are written alternately in the course of carrying out the writing operations (b) and (c).

37. A method as claimed in claim 32, wherein:
each information item has a corresponding pointer indicating in which of the first and second storage-location pairs allocated thereto the item concerned is currently held;
in operation (a), for each of the third and fourth information items, the determination of the storage-location pair currently holding the item concerned is made using the pointer corresponding to that item; and
for each of said first and second information items, the pointer corresponding to the item concerned is updated to indicate in which of the first and second storage-location pairs allocated thereto the item concerned is written in operation (b) or (c).

38. Memory access circuitry, for use with a random access memory that has first and second storage portions accessible via a common data bus and that has at least one type of access operation involving a predetermined protocol sequence before and/or after data of the operation is transferred via the common data bus, which circuitry comprises:
allocation means for allocating each information item respective first and second storage locations in said memory, which first and second locations are in said first and second storage portions respectively;
determining means for determining, when a first such information item is to be written in the memory and a second such information item is to be read out from or written in the memory, which of the first and second storage locations allocated to the second information item is to be accessed;
first access means for carrying out a first access operation in which the first information item is written in the first storage location allocated thereto if the determined storage location is such a second storage location and in which the first information item is written in the second storage location allocated thereto if the determined storage location is such a first storage location;
second access means for carrying out a second access operation in which the second information item is read out from or written in the determined storage location; and
control means for controlling the relative timing of the first and second access operations such that for at least one of the two access operations, which involves such a protocol sequence, its said protocol sequence overlaps at least partially with transfer, via said common data bus, of data of the other of the two access operations.

39. Circuitry as claimed in claim 38, further comprising pointer means for providing each said information item with a corresponding pointer indicating in which of the first and second storage locations allocated thereto the item concerned is currently held;
said determining means being operable to determine the storage location currently holding said second information item using the pointer corresponding to that item; and
said first access means being operable to update the pointer corresponding to said first information item to indicate in which of the first and second storage locations allocated thereto the item concerned is written in said first access operation.

40. Memory access circuitry, for use with a random access memory having first and second storage portions that are accessed via a common data bus, which circuitry comprises:
allocation means for allocating each information item a first storage location for storing a first part of the item and a second storage location for storing a second part of the item, the first and second storage locations being in said first and second storage portions respectively;
first writing means for writing said first part of said first information item in said first storage location allocated to that item;
second writing means for writing said second part of said first information item in said second storage location allocated to that item;
first reading means for reading said first part of said second information item from said first storage location allocated to that item;
second reading means for reading said second part of said second information item from said second storage location allocated to that item; and
access control means operable, when in the same time slot a first such information item is to be written in the memory and a second such information item is to be read from the memory, to activate each of said first and second writing means and each of said first and second reading means once in a predetermined sequence.

41. Memory access circuitry, for use with a random access memory having respective first and second storage portions that are accessed via a first common data bus and also having respective third and fourth storage portions that are accessed via a second common data bus, which circuitry comprises:

allocation means for allocating each information item respective first, second, third and fourth storage locations in the first, second, third and fourth storage portions respectively; and determining means, operable when in the same time slot first and second such information items are to be written in the memory and third and fourth such information items are to be read from the memory, to determine which of the storage locations allocated to the third information item currently holds that item and to determine which of the storage locations allocated to the fourth information item currently holds that item, and to identify the storage portion(s) in which the two determined storage locations are included;

writing means for writing the first and second information items to respective storage locations in two different storage portions other than the storage portion(s) identified by the determining means; and reading means for reading said third and fourth information items from their respective storage locations determined by the determining means.

42. Circuitry as claimed in claim 41, further comprising pointer means for providing each said information item with a corresponding pointer indicating in which of said first, second, third and fourth storage locations allocated thereto the item concerned is currently held;

said determining means being operable to determine, for each of the third and fourth information items, the storage location currently holding the item concerned using the pointer corresponding to that item; and said writing means being operable, for each of the first and second information items, to update the pointer corresponding to the item concerned to indicate in which of the first, second, third and fourth storage locations allocated thereto the item concerned is written by the writing means.

43. Memory access circuitry, for use with a random access memory having respective first and second storage portions that are accessed via a first common data bus and also having respective third and fourth storage portions that are accessed via a second common data bus, which circuitry comprises:

allocation means for allocating each information item respective first and second pairs of storage locations, each pair being made up of a first storage location for storing a first part of the item concerned and a second storage location for storing a second part of the item concerned, said first and second storage locations of the first storage-location pair being in the first and second storage portions respectively and said first and second storage locations of the second storage-location pair being in the third and fourth storage portions respectively;

determining means operable, when in the same time slot first and second such information items are to be written in the memory and third and fourth such information items are to be read from the memory, to determine, for each of the third and fourth information items, which of the first and second pairs of storage locations allocated to the item currently holds the item;

first writing means for writing the first and second parts of the first information items in the first and second storage locations respectively of the storage-location pair other than the storage-location pair determined for the third information item by the determining means;

second writing means for writing the first and second parts of the second information item in the first and second storage locations respectively of the storage-location pair other than the storage-location pair determined for the fourth information item by the determining means;

first reading means for reading the first and second parts of the third information item from the first and second storage locations respectively of the determined storage-location pair for that item; and second reading means for reading the first and second parts of the fourth information item from the first and second storage location respectively of the determined storage-location pair for that item.

44. Circuitry as claimed in claim 43, further comprising pointer means for providing each information item with a corresponding pointer indicating in which of the first and second storage-location pairs allocated thereto the item concerned is currently held;

said determining means being operable, for each of the third and fourth information items, to determine the storage-location pair currently holding the item concerned using the pointer corresponding to that item; and said first and second writing means being operable to update the pointers corresponding respectively to the first and second items to indicate in which of the first and second storage-location pairs allocated thereto the item concerned is written by the writing means concerned.

45. Memory access circuitry, for use with a random access memory that has first and second storage portions accessible via a common data bus and that has at least one type of access operation involving a predetermined protocol sequence before and/or after data of the operation is transferred via the common data bus, which circuitry comprises:

an allocation unit which allocates each information item respective first and second storage locations in said memory, which first and second locations are in said first and second storage portions respectively;

a determining unit which determines, when a first such information item is to be written in the memory and a second such information item is to read out from or written in the memory, which of the first and second storage locations allocated to the second information item is to be accessed;

a first access unit which carries out a first access operation in which the first information item is written in the first storage location allocated thereto if the determined storage location is one of said second storage locations and in which the first information item is written in the second storage location allocated thereto if the determined storage location is one of said first storage locations;

a second access unit which carries out a second access operation in which the second information item is read out from or written in the determined storage location; and a control unit which controls the relative timing of the first and second access operations such that for at least one of the two access operations, which involves such a protocol sequence, its said protocol sequence overlaps at least partially with transfer, via said common data bus, of data of the other of the two access operations.

46. Circuitry as claimed in claim 45, further comprising a pointer memory which provides each said information item with a corresponding pointer indicating in which of the first and second storage locations allocated thereto the item concerned is currently held;

wherein:

said determining unit determines the storage location currently holding said second information item using the pointer corresponding to that item; and said first access unit updates the pointer corresponding to said first information item to indicate in which of the first and second storage locations allocated thereto the item concerned is written in said first access operation.

47. Memory access circuitry, for use with a random access memory having first and second storage portions that are accessed via a common data bus, which circuitry comprises:

an allocation unit which allocates each information item a first storage location for storing a first part of the item and a second storage location for storing a second part of the item, the first and second storage locations being in said first and second storage portions respectively;

a first writing unit which writes said first part of said first information item in said first storage location allocated to that item;

a second writing unit which writes said second part of said first information item in said second storage location allocated to that item;

a first reading unit which reads said first part of said second information item from said first storage location allocated to that item;

a second reading unit which reads said second part of said second information item from said second storage location allocated to that item; and an access control unit which, when in the same time slot a first such information item is to be written in the memory and a second such information item is to be read from the memory, activates each of said first and second writing units and each of said first and second reading units once in a predetermined sequence.

48. Memory access circuitry, for use with a random access memory having respective first and second storage portions that are accessed via a first common data bus and also having repsective third and fourth storage portions that are accessed via a second common data bus, which circuitry comprises:

an allocation unit which allocates each information item respective first, second, third and fourth storage locations in the first, second, third and fourth storage portions respectively; and a determining unit which, when in the same time slot first and second such information items are to be written in the memory and third and fourth such information items are to be read from the memory, determines which of the storage locations allocated to the third information item currently holds that item and determines which of the storage locations allocated to the fourth information item currently holds that item, and identifies the storage portion(s) in which the two determined storage locations are included;

a writing unit which writes the first and second information items to respective storage locations in two different storage portion(s) other than the storage portions identified by the determining unit; and a reading unit which reads third and fourth information items from their respective storage locations determined by the determining unit.

49. Circuitry as claimed in claim 48, further comprising a pointer memory which provides each said information item with a corresponding pointer indicating in which of said first, second, third and fourth storage locations allocated thereto the item concerned is currently held;

wherein:

said determining unit determines, for each of the third and fourth information items, the storage location currently holding the item concerned using the pointer corresponding to that item; and said writing unit updates the pointer corresponding to each of the first and second information items to indicate in which of the first, second, third and fourth storage locations allocated thereto the item is written by the writing unit.

50. Memory access circuitry, for use with a random access memory having respective first and second storage portions that are accessed via a first common data bus and also having respective third and fourth storage portions that are accessed via a second common data bus, which circuitry comprises:

an allocation unit which allocates each information item respective first and second pairs of storage locations, each pair being made up of a first storage location for storing a first part of the item concerned and a second storage location for storing a second part of the item concerned, said first and second storage portions locations of the first storage-location pair being in the first and second storage portions respectively and said first and second storage locations of the second storage-location pair being in the third and fourth storage portions respectively;

a determining unit which, when in the same time slot first and second such information items are to be written in the memory and third and fourth such information items are to be read from the memory, determines, for each of the third and fourth information items, which of the first and second pairs of storage locations allocated to the item currently holds the item;

a first writing unit which writes the first and second parts of the first information items in the first and second storage locations respectively of the storage-location pair other than the storage-location pair determined for the third information item by the determining unit;

a second writing unit which writes the first and second parts of the second information item in the first and second storage locations respectively of the storage-location pair other than the storage-location pair determined for the fourth information item by the determining unit;

a first reading unit which reads the first and second parts of the third information item from the first and second storage locations respectively of the determined storage-location pair for that item; and a second reading unit which reads the first and second parts of the fourth information item from the first and second storage locations respectively of the determined storage-location pair for that item.

51. Circuitry as claimed in claim 50, further comprising a pointer memory which provides each information item with a corresponding pointer indicating in which of the first and second storage-location pairs allocated thereto the item concerned is currently held;

wherein:

said determining unit determines, for each of the third and fourth information items, the storage-location pair currently holding the item concerned using the pointer corresponding to that item; and said first and second writing units update the pointers corresponding respectively to the first and second items to indicate in which of the first and second storage-location pairs allocated thereto the item concerned is written by the writing unit concerned.

* * * * *

UNITED STATES PATENT AND TRADEMARK OFFICE
CERTIFICATE OF CORRECTION

PATENT NO.     : 6,418,077 B1
DATED          : July 9, 2002
INVENTOR(S)    : Finbar Naven It is certified that error appears in the above-identified patent and that said Letters Patent is hereby corrected as shown below:

<u>Column 27,</u>
Lines 29 and 26, change "step" to -- operation --.

<u>Column 28,</u>
Line 60, change "steps" to -- operations --.

<u>Column 29,</u>
Lines 29, 30 and 32, change "step" to -- operation --.

<u>Column 33,</u>
Line 58, after "of" insert -- : --.

Signed and Sealed this

Seventh Day of January, 2003

JAMES E. ROGAN
*Director of the United States Patent and Trademark Office*